United States Patent
Tanifuji et al.

(10) Patent No.: US 9,200,360 B2
(45) Date of Patent: Dec. 1, 2015

(54) ARC EVAPORATION SOURCE AND FILM FORMING METHOD USING THE SAME

(75) Inventors: Shinichi Tanifuji, Kobe (JP); Kenji Yamamoto, Kobe (JP); Hirofumi Fujii, Takasago (JP); Yoshinori Kurokawa, Takasago (JP)

(73) Assignee: Kobe Steel, Ltd., Kobe-shi (JP)

( * ) Notice: Subject to any disclaimer, the term of this patent is extended or adjusted under 35 U.S.C. 154(b) by 759 days.

(21) Appl. No.: 13/263,946

(22) PCT Filed: Apr. 14, 2010

(86) PCT No.: PCT/JP2010/002712
§ 371 (c)(1),
(2), (4) Date: Oct. 11, 2011

(87) PCT Pub. No.: WO2010/125756
PCT Pub. Date: Nov. 4, 2010

(65) Prior Publication Data
US 2012/0037493 A1 Feb. 16, 2012

(30) Foreign Application Priority Data

Apr. 28, 2009 (JP) .................. 2009-109305
Feb. 5, 2010 (JP) .................. 2010-024315

(51) Int. Cl.
C23C 14/00 (2006.01)
C23C 14/32 (2006.01)
C23C 14/54 (2006.01)
H01J 37/32 (2006.01)

(52) U.S. Cl.
CPC ............... *C23C 14/325* (2013.01); *C23C 14/54* (2013.01); *H01J 37/32055* (2013.01)

(58) Field of Classification Search
CPC .. H01J 37/32055; C23C 14/325; C23C 14/54

USPC .................. 118/726; 204/192.38, 298.41
See application file for complete search history.

(56) References Cited

U.S. PATENT DOCUMENTS 4,839,011 A * 6/1989 Ramalingam et al. ... 204/192.38
5,618,590 A * 4/1997 Naruse et al. ............ 427/528
(Continued)

FOREIGN PATENT DOCUMENTS

CN 1494603 A 5/2004
JP 63 446 1/1988
(Continued)

OTHER PUBLICATIONS align. (n.d.) American Heritage® Dictionary of the English Language, Fifth Edition. (2011). Retrieved Jun. 15, 2015 from http://www.thefreedictionary.com/align.*

(Continued)

*Primary Examiner* — John Brayton
(74) *Attorney, Agent, or Firm* — Oblon, McClelland, Maier & Neustadt, L.L.P.

(57) ABSTRACT

Provided is an arc evaporation source wherein film-forming speed is increased by inducing magnetic lines in the substrate direction. The arc evaporation source is provided with: at least one outer circumferential magnet (3), which is disposed such that the outer circumferential magnet surrounds the outer circumference of a target (2) and that the magnetization direction thereof is in the direction orthogonally intersecting the surface of the target (2); and a rear surface magnet (4) disposed on the rear surface side of the target (2). The rear surface magnet (4) has a non-ring-shaped first permanent magnet (4A) wherein the polarity thereof faces the same direction as the polarity of the outer circumferential magnet (3) and the magnetization direction of the rear surface magnet (4) is in the direction orthogonally intersecting the surface of the target (2).

28 Claims, 19 Drawing Sheets

(56) References Cited

U.S. PATENT DOCUMENTS

| | | | |
|---|---|---|---|
| 6,334,405 B1 | 1/2002 | Takahara et al. | |
| 2002/0125127 A1 | 9/2002 | Watanabe et al. | |
| 2004/0112736 A1 | 6/2004 | Larrinaga | |
| 2006/0137978 A1* | 6/2006 | Curtins | 204/298.41 |
| 2006/0175190 A1* | 8/2006 | Schuetze et al. | 204/192.38 |
| 2006/0237309 A1* | 10/2006 | Goikoetxea Larrinaga | 204/298.41 |
| 2009/0050059 A1* | 2/2009 | Goikoetxea Larrinaga | 118/726 |
| 2010/0213055 A1* | 8/2010 | Vetter | 204/298.41 |

FOREIGN PATENT DOCUMENTS

| | | | |
|---|---|---|---|
| JP | 07 180043 | | 7/1995 |
| JP | 2000 328236 | | 11/2000 |
| JP | 2002-194541 | | 7/2002 |
| JP | 2004 523658 | | 8/2004 |
| JP | 2007 056347 | | 3/2007 |
| KR | 2002-0052985 | | 7/2002 |
| WO | WO 2008/125397 | * | 10/2008 |

OTHER PUBLICATIONS

Office Action issued Nov. 30, 2012 in Chinese Patent Application No. 201080011271.7 (with English translation).

Korean Office Action issued Jun. 3, 2013, in Korea Patent Application No. 10-2011-7025507 (with English translation).

International Search Report Issued May 18, 2010 in PCT/JP10/002712 filed Apr. 14, 2010.

* cited by examiner

FIG. 1
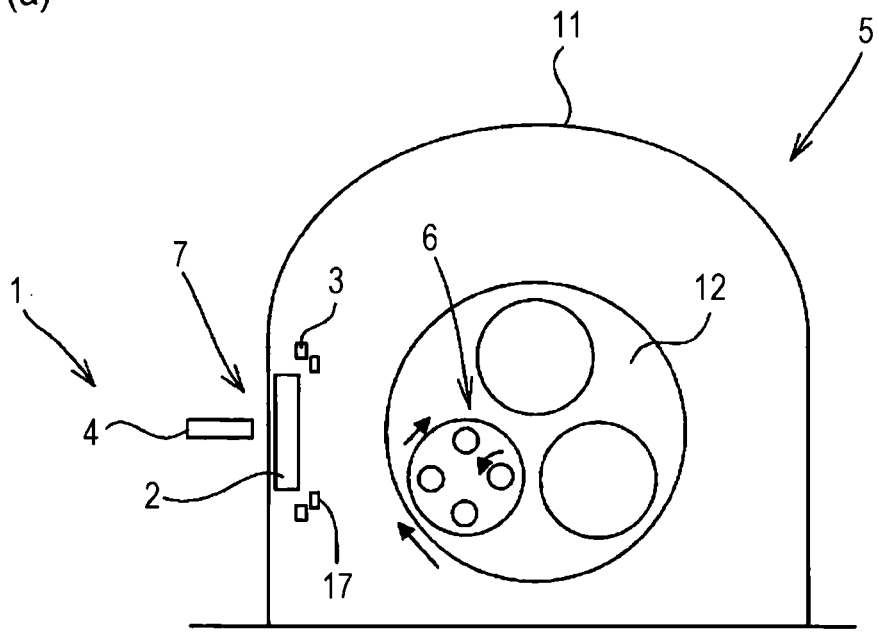
(a)
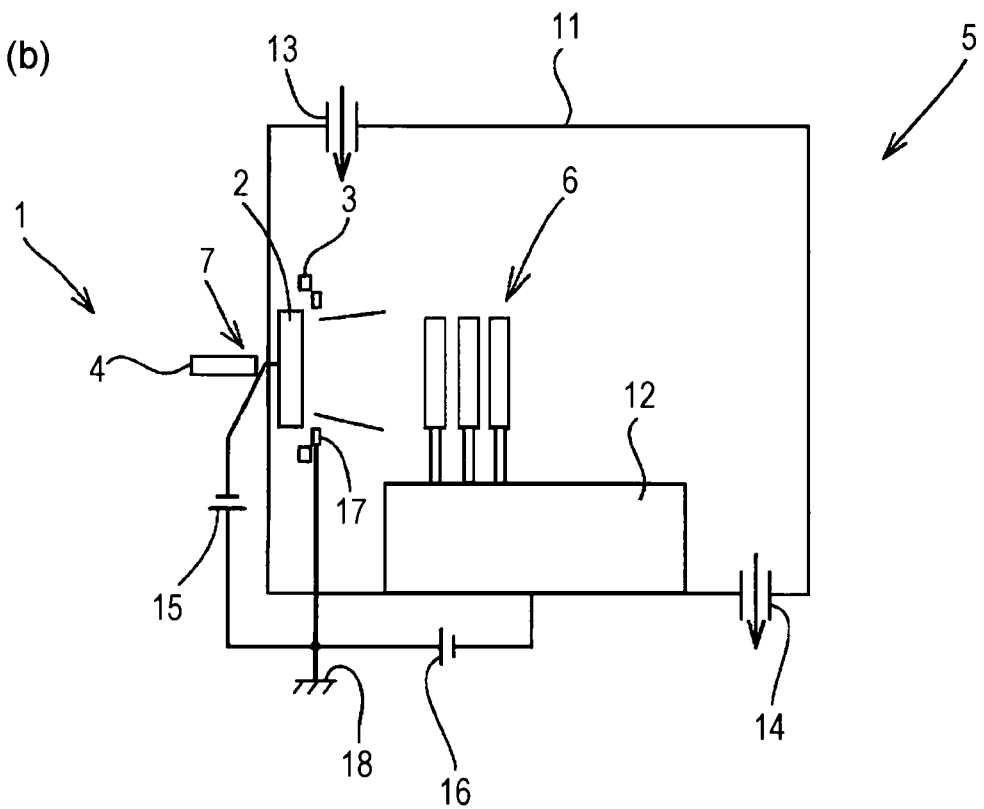
(b)

COMPARATIVE TECHNIQUE

WITHOUT REAR SURFACE MAGNET

DISK-SHAPED REAR SURFACE MAGNET
DIAMETER: 40 mm, THICKNESS: 50 mm
DISTANCE FROM SURFACE OF TARGET: 90 mm

DISK-SHAPED REAR SURFACE MAGNET
DIAMETER: 80 mm, THICKNESS: 15 mm
DISTANCE FROM SURFACE OF TARGET: 90 mm

DISK-SHAPED REAR SURFACE MAGNET
DIAMETER: 100 mm, THICKNESS: 3 mm
DISTANCE FROM SURFACE OF TARGET: 40 mm

DISK-SHAPED REAR SURFACE MAGNET
DIAMETER: 100 mm, THICKNESS: 3 mm
DISTANCE FROM SURFACE OF TARGET: 50 mm

DISK-SHAPED REAR SURFACE MAGNET
DIAMETER: 100 mm, THICKNESS: 3 mm
DISTANCE FROM SURFACE OF TARGET: 60 mm

DISK-SHAPED REAR SURFACE MAGNETS
DIAMETER OF BOTH MAGNETS: 100 mm, THICKNESS: 3 mm
DISTANCE FROM SURFACE OF TARGET: FIRST MAGNET 50 mm
　　　　　　　　　　　　　　　　　　SECOND MAGNET 80 mm

RING-SHAPED REAR SURFACE MAGNET
OUTER DIAMETER: 40 mm, INNER DIAMETER: 20 mm, THICKNESS: 20 mm
DISTANCE FROM SURFACE OF TARGET: 30 mm

RING-SHAPED REAR SURFACE MAGNET
OUTER DIAMETER: 170 mm, INNER DIAMETER: 150 mm, THICKNESS: 20 mm
DISTANCE FROM SURFACE OF TARGET: 30 mm

DISK-SHAPED REAR SURFACE MAGNET
DIAMETER: 100 mm, THICKNESS: 3 mm, DISTANCE: 40 mm
RING-SHAPED REAR SURFACE MAGNET
OUTER DIAMETER: 170 mm, INNER DIAMETER: 150 mm,
THICKNESS: 10 mm, DISTANCE: 40 mm

DISK-SHAPED REAR SURFACE MAGNET
DIAMETER: 100 mm, THICKNESS: 3 mm, DISTANCE: 40 mm
RING-SHAPED REAR SURFACE MAGNET
OUTER DIAMETER: 170 mm, INNER DIAMETER: 150 mm,
THICKNESS: 20 mm, DISTANCE: 30 mm

DISK-SHAPED REAR SURFACE MAGNET
DIAMETER: 50 mm, THICKNESS: 10 mm, DISTANCE: 40 mm
RING-SHAPED REAR SURFACE MAGNET
OUTER DIAMETER: 170 mm, INNER DIAMETER: 150 mm,
THICKNESS: 20 mm, DISTANCE: 30 mm

DISK-SHAPED REAR SURFACE MAGNET
DIAMETER: 25 mm, THICKNESS: 24 mm, DISTANCE: 40 mm
RING-SHAPED REAR SURFACE MAGNET
OUTER DIAMETER: 170 mm, INNER DIAMETER: 150 mm,
THICKNESS: 20 mm, DISTANCE: 30 mm

DISK-SHAPED REAR SURFACE MAGNET
DIAMETER: 100 mm, THICKNESS: 3 mm, DISTANCE: 50 mm
RING-SHAPED REAR SURFACE MAGNET
OUTER DIAMETER: 170 mm, INNER DIAMETER: 150 mm,
THICKNESS: 20 mm, DISTANCE: 50 mm

ARC EVAPORATION SOURCE AND FILM FORMING METHOD USING THE SAME

TECHNICAL FIELD

The present invention relates to an arc evaporation source used in a deposition apparatus that forms a thin film such as an amorphous carbon film or a ceramic film composed of a nitride or an oxide for improving abrasion resistance of a mechanical component or the like, and to a film forming method using the arc evaporation source.

BACKGROUND ART

In the related art, physical vapor deposition, such as arc ion plating and sputtering, is widely known as a technique for coating a surface of a substrate, such as a mechanical component, a cutting tool, or a slidable component, with a thin film for the purpose of improving abrasion resistance, sliding properties, and protective functions. For arc ion plating, cathode-discharge-type arc evaporation sources are used.

A cathode-discharge-type arc evaporation source generates an arc discharge on a surface of a target, which is a cathode, so as to instantaneously melt the material constituting the target. Then, the ionized material is drawn toward a surface of a substrate, which is an object to be processed, so as to form a thin film on the substrate. Since such an arc evaporation source has characteristics in which the evaporation rate of the target is high and the ionization rate of the evaporated material constituting the target is high, a dense film can be formed by applying bias to the substrate during the deposition process. Therefore, the arc evaporation source is industrially used for forming an abrasion-resistant film for a cutting tool or the like.

However, in the case where an arc discharge is to be generated between the cathode (target) and an anode, when evaporation of the target centered on an electron emission point (arc spot) at the cathode side occurs, the target melts and is released from near the spot, and the molten material adheres to the object to the processed, sometimes resulting in a reduced degree of surface roughness.

The amount of the molten target material (macro-particles: electrically neutral droplets) released from the arc spot in this manner tends to be suppressed when the arc spot moves at a high rate, and this moving rate is known to be affected by a magnetic field applied to the target.

Furthermore, since target atoms evaporated due to the arc discharge are ionized within an arc plasma, there is a problem in that an ion trajectory extending from the target toward the substrate is affected by the magnetic field between the target and the substrate.

In order to solve these problems, there have been proposed the following attempts to control the movement of the arc spot by applying a magnetic field to the target. For example, PTL 1 discloses a technique in which a ring-shaped magnetic generating mechanism (permanent magnet, electromagnetic coil) is disposed around the target so as to apply a vertical magnetic field to the surface of the target. PTL 2 discloses a technique in which a mechanism (electromagnetic coil) for generating a magnetic force for converging the ionized material constituting the target is disposed in front of the target so that the ionized material is efficiently converged in the direction toward the substrate. PTL 3 discloses a technique in which a permanent magnet is set in the center of the rear face of the target in the arc evaporation source, a ring-shaped magnet having a different polarity is disposed at the rear side of the target so as to surround the permanent magnet, and an electromagnetic coil substantially having the same diameter as the ring-shaped magnet and forming components of a magnetic field that keeps an arc discharge confined is provided. PTL 4 discloses a technique in which a magnetic field that is parallel with the surface of the target is generated by a rear-surface electromagnetic coil and a ring-shaped magnet disposed around the target.

However, in the magnetic generating mechanism in PTL 1, since magnetic lines of force from the surface of the target extend toward a ring-shaped magnet, many of the ions are induced toward the magnet. In addition, since magnetic lines of force extending toward the substrate in front of the target significantly diverge from the direction toward the substrate, the evaporated and ionized material constituting the target cannot efficiently reach the substrate.

In the technique discussed in PTL 2, although magnetic lines of force extend toward the substrate, since it is necessary to dispose the electromagnetic coil, which is large is size, between the target and the substrate, the distance between the target and the substrate inevitably increases, resulting in a reduced deposition rate.

Furthermore, although an arc discharge tends to occur by priority at a point where perpendicular components of a magnetic field become zero (i.e., components of a magnetic field that are perpendicular to the surface of the target), since the point where the perpendicular components of the magnetic field become zero is trapped at a substantially intermediate region between the permanent magnet and the ring-shaped magnet in the arrangement disclosed in PTL 3, it is difficult to control the arc discharge to an inner peripheral region relative to the aforementioned point even by using the electromagnetic coil, and the utilization efficiency of the target is not high. Moreover, with the arrangement in PTL 3, since there are no magnetic lines of force extending forward from the target, the ions emitted from the target cannot be efficiently converged in the direction toward the substrate.

PTL 4 only discloses an embodiment in which the inner diameter of the electromagnetic coil is smaller than the diameter of the target. In this embodiment, since magnetic lines of force tend to disperse outward from the target, it is conceivable that ions cannot be converged efficiently. Furthermore, in order to move an arc plasma discharge at a high rate, it is necessary to increase the strength of the magnetic field that is parallel with the surface of the target. To achieve this, the electromagnetic coil (or a magnetic yoke) needs to be increased in size, and a large electric current needs to be supplied to the electromagnetic coil. Since this leads to an increase in size of the evaporation source, this is not industrially desirable.

FIG. 5 is a distribution diagram of magnetic lines of force in the technique discussed in PTL 4 (i.e., a technique in which an electromagnetic coil having an inner diameter smaller than the diameter of the target is disposed at the rear side of the target and a core is disposed within the inner periphery of the electromagnetic coil, which will simply be referred to as "comparative technique" hereinafter).

CITATION LIST

Patent Literature

PTL 1: Japanese Unexamined Patent Application Publication No. 2000-328236

PTL 2: Japanese Unexamined Patent Application Publication No. 07-180043

PTL 3: Japanese Unexamined Patent Application Publication No. 2007-056347

PTL 4: PCT Japanese Translation Patent Publication No. 2004-523658

SUMMARY OF INVENTION

In view of the problems described above, an object of the present invention is to provide an arc evaporation source with a high deposition rate.

In order to achieve the aforementioned object, the present invention employs the following technical solutions.

An arc evaporation source according to the present invention evaporates a surface of a target by an arc discharge and includes at least one outer circumferential magnet that is provided to surround an outer periphery of the target and that is disposed such that a direction of magnetization thereof is normal to the surface of the target, and a rear surface magnet disposed at a rear side of the target. The rear surface magnet has a first non-ring-shaped permanent magnet disposed such that a polarity of the rear surface magnet and a polarity of the outer circumferential magnet are oriented in the same direction and that a direction of magnetization of the rear surface magnet is normal to the surface of the target.

Another arc evaporation source according to the present invention evaporates a surface of a target by an arc discharge and includes at least one outer circumferential magnet that is provided to surround an outer periphery of the target and that is disposed such that a direction of magnetization thereof is normal to the surface of the target, and a rear surface magnet disposed at a rear side of the target. The rear surface magnet has a ring-shaped permanent magnet which is a permanent magnet provided in the form of a ring such that a polarity of the rear surface magnet and a polarity of the outer circumferential magnet are oriented in the same direction and that a direction of magnetization of the rear surface magnet is normal to the surface of the target. A projection of the ring-shaped permanent magnet and a projection of the target obtained by projecting the ring-shaped permanent magnet and the target in the direction normal to the surface of the target do not overlap each other.

Another arc evaporation source according to the present invention evaporates a surface of a target by an arc discharge and includes at least one outer circumferential magnet that is provided to surround an outer periphery of the target and that is disposed such that a direction of magnetization thereof is normal to the surface of the target, and a rear surface magnet disposed at a rear side of the target. The rear surface magnet is formed of a permanent magnet disposed such that a polarity of the rear surface magnet and a polarity of the outer circumferential magnet are oriented in the same direction and that a direction of magnetization of the rear surface magnet is normal to the surface of the target.

A film forming method according to the present invention includes evaporating a target including at least two elements by using the aforementioned arc evaporation source so as to form a film including the at least two elements.

Another film forming method according to the present invention includes evaporating a target including at least one of Al, Ti, and Cr elements by using the aforementioned arc evaporation source so as to form a film composed of a nitride, a carbide, or a carbonitride comprising the element to a thickness of at least 5 μm.

According to the present invention, the deposition rate of a deposition apparatus equipped with an arc evaporation source can be increased.

BRIEF DESCRIPTION OF DRAWINGS

FIG. 1 schematically illustrates a deposition apparatus equipped with an arc evaporation source according to an embodiment of the present invention.

DESCRIPTION OF EMBODIMENTS

Figure 2:
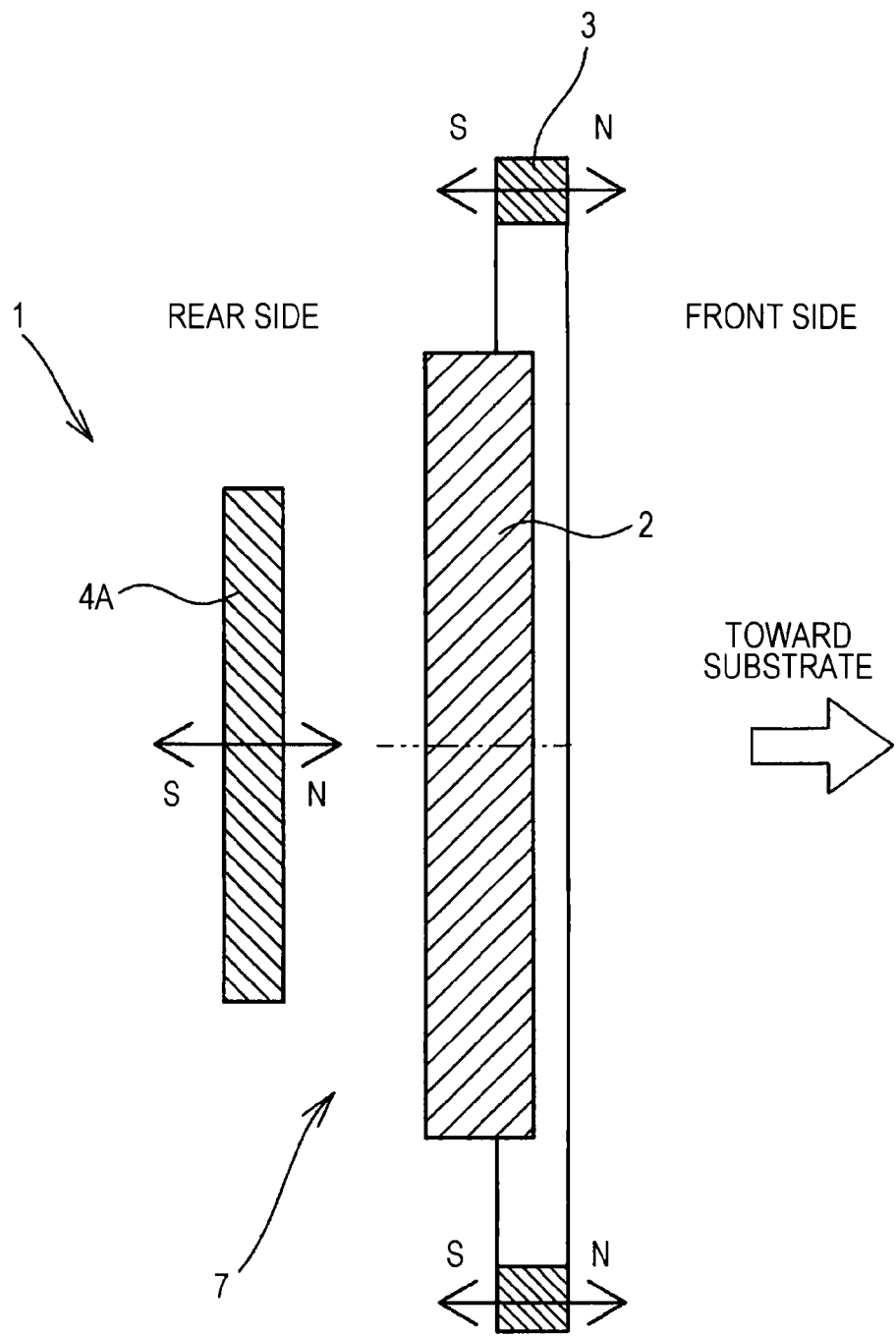
FIG. 2 schematically illustrates an arc evaporation source according to a first embodiment of the present invention.

Embodiments of the present invention will be described below with reference to the attached drawings. The following embodiments are specific examples of the present invention and are not to limit the technical scope of the invention.

The embodiments of the present invention will be described below with reference to the drawings.

FIG. 1 illustrates a deposition apparatus 5 equipped with an arc evaporation source 1 (referred to as "evaporation source 1" hereinafter) according to an embodiment of the present invention.

The deposition apparatus 5 includes a vacuum chamber 11. A rotating table 12 that supports a substrate 6, which is an object to be processed, and the evaporation source 1 attached facing the substrate 6 are provided within the vacuum chamber 11. The vacuum chamber 11 is provided with a gas inlet 13 that introduces reactive gas into the vacuum chamber 11 and a gas outlet 14 that discharges the reactive gas from the vacuum chamber 11.

In addition, the deposition apparatus 5 includes an arc power source 15 for applying negative bias to a target 2 and a bias power source 16 for applying negative bias to the substrate 6. The positive electrodes of the two power sources 15 and 16 are connected to ground 18.

As shown in FIG. 1, the evaporation source 1 has the target 2, which is disk-shaped (the term "disk-shaped" used hereinafter also includes a cylindrical shape having a predetermined height), magnetic-field generating means 7 disposed in the vicinity of the target 2, and an anode 17 disposed on the outer periphery of the target 2. The anode 17 is connected to the ground 18. Due to being connected to the ground 18 and having the same electric potential as the anode 17, the vacuum chamber 11 can function as the anode 17. Specifically, the evaporation source 1 is an arc evaporation source of a cathode discharge type.

The target 2 is composed of a material that includes an element (e.g., chromium (Cr), titanium (Ti), titanium aluminide (TiAl), or carbon (C)) selected in accordance with a thin film to be formed on the substrate 6.

The magnetic-field generating means 7 has an outer circumferential magnet 3 disposed around the outer periphery of the target 2 and a rear surface magnet 4 disposed at the rear side of the target 2. The outer circumferential magnet 3 and the rear surface magnet 4 are disposed such that the polarity of the outer circumferential magnet 3 and the polarity of the rear surface magnet 4 are oriented in the same direction.

Figure 3:
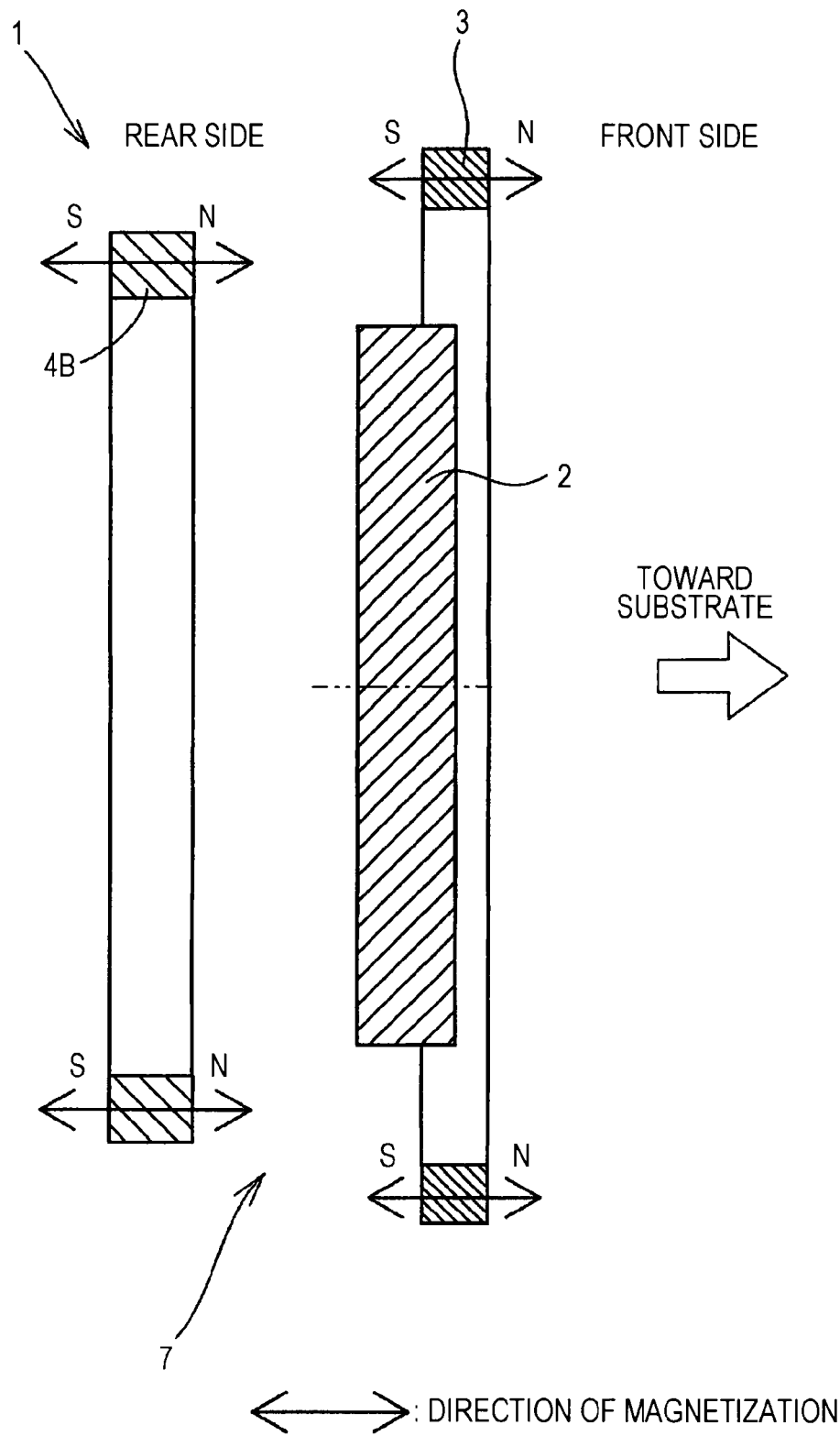
FIG. 3 schematically illustrates an arc evaporation source according to a second embodiment of the present invention.
Figure 4:
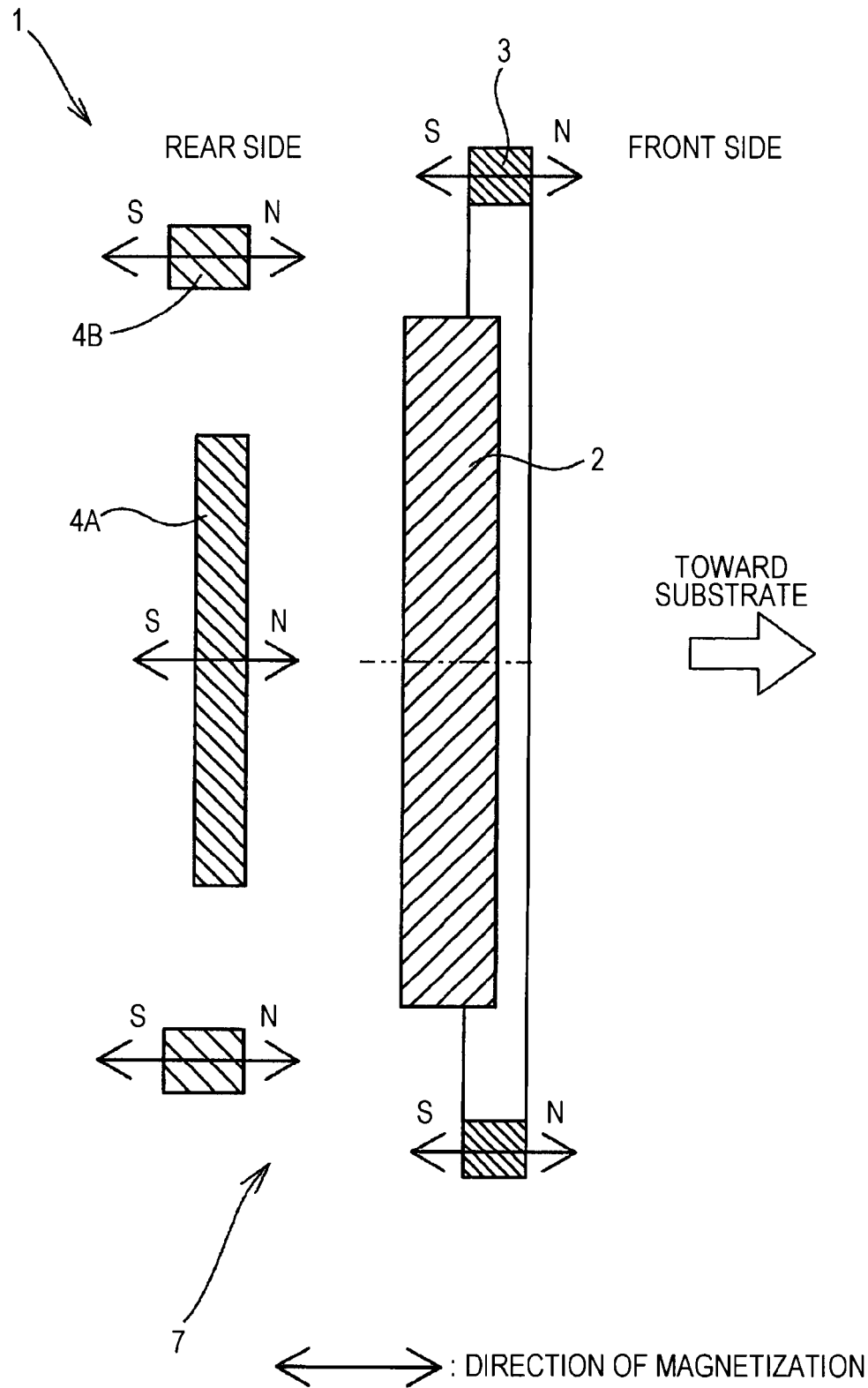
FIG. 4 schematically illustrates an arc evaporation source according to third and fourth embodiments of the present invention.

An evaporation surface (i.e., a surface facing toward the substrate 6) of the target 2 will be defined as a "front surface", whereas a surface opposite to the evaporation surface will be defined as a "rear surface" (see FIGS. 2 to 4).

Each of the outer circumferential magnet 3 and the rear surface magnet 4 is a permanent magnet formed of a neodymium magnet having high magnetic coercivity.

The outer circumferential magnet 3 is ring-shaped and is disposed coaxially with the target 2. The direction of magnetization of the outer circumferential magnet 3 is set parallel with the axis of the target 2 (i.e., is normal to the evaporation surface of the target 2). Furthermore, at least a portion of a projection of the outer circumferential magnet 3 when projected in the radial direction thereof is disposed so as to overlap a projection of the target 2 when projected in the radial direction thereof. Specifically, the outer circumferential magnet 3 is positioned relative to the target 2 such that the projections of the outer circumferential magnet 3 and the target 2 formed by projecting the outer circumferential magnet 3 and the target 2 in a direction parallel with the evaporation surface of the target 2 overlap each other.

Although the outer circumferential magnet 3 is described above as being ring-shaped, the shape of the outer circumferential magnet 3 is not limited to a ring shape, but may be provided at least in the form of a ring. In detail, for example, a plurality of outer circumferential magnets 3 formed of cylindrical permanent magnets may be prepared, and these outer circumferential magnets 3 may be arranged in the form of a ring so as to surround the outer periphery of the target 2. Specifically, the expression "provided in the form of a ring" includes not only a configuration in which the outer circumferential magnet 3 itself has a ring shape, but also a configuration in which multiple outer circumferential magnets 3 are arranged along the outer periphery of the target 2.

The rear surface magnet 4 is disposed at the rear side of the target 2 such that the direction of magnetization thereof is parallel with the axis of the target 2 (i.e., is normal to the evaporation surface of the target 2).

Although N poles of both the outer circumferential magnet 3 and the rear surface magnet 4 are disposed at a side proximate to the substrate 6 and S poles of both the outer circumferential magnet 3 and the rear surface magnet 4 are disposed at a side distant from the substrate 6 in FIGS. 2 to 4, the disposition thereof is not limited. In detail, the S poles of both the outer circumferential magnet 3 and the rear surface magnet 4 may be disposed at the side proximate to the substrate 6 and the N poles of both the outer circumferential magnet 3 and the rear surface magnet 4 may be disposed at the side distant from the substrate 6.

Because the magnetic-field generating means 7 has the above-described configuration, magnetic lines of force can be induced toward the substrate 6 by a combination of a magnetic field generated by the outer circumferential magnet 3 surrounding the outer periphery of the target 2 and a magnetic field generated by the rear surface magnet 4 at the rear side of the target 2.

The rear surface magnet 4 used in this embodiment may be of a non-ring-shaped type, such as a disk-shaped rear surface magnet 4A to be described below, or of a ring-shaped type, such as a ring-shaped rear surface magnet 4B to be described below. The term "non-ring-shaped type" used in this case does not refer to a hollow donut-like type with a hole in a radially inner section, but refers to a solid type including a disk-shaped type or a cylindrical type. A more preferred example of a "non-ring shape" includes a shape in which normal lines of the entire outer side surface of the rear surface magnet do not intersect.

FIG. 2 illustrates the magnetic-field generating means 7 according to a first embodiment in which the disk-shaped rear surface magnet 4A (first permanent magnet), to be described below, is used as the rear surface magnet 4. FIG. 3 illustrates the magnetic-field generating means 7 according to a second embodiment in which the ring-shaped rear surface magnet 4B (ring-shaped permanent magnet), to be described below, is used as the rear surface magnet 4. FIG. 4 illustrates the magnetic-field generating means 7 according to a third embodiment in which the disk-shaped rear surface magnet 4A and the ring-shaped rear surface magnet 4B are simultaneously used as the rear surface magnet 4.

Next, a method of forming a film by using the deposition apparatus 5 equipped with the evaporation source 1 will be described.

First, the vacuum chamber 11 is set in a vacuum state by vacuuming, and argon (Ar) gas or the like is subsequently introduced therein via the gas inlet 13. Then, impurities, such as oxides, on the target 2 and the substrate 6 are removed therefrom by sputtering. After setting the vacuum chamber 11 in a vacuum state again, reactive gas is introduced into the vacuum chamber 11 via the gas inlet 13. In this state, an arc discharge is generated on the target 2 set in the vacuum chamber 11 so that the material constituting the target 2 is turned into plasma and made to react with the reactive gas. Then, the target 2 turned into plasma is drawn toward the surface of the substrate 6, whereby a nitride film, an oxide film, a carbonized film, a carbonitride film, or an amorphous carbon film is formed over the substrate 6 placed on the rotating table 12.

The reactive gas can be selected from among nitrogen gas ($N_2$), oxygen gas ($O_2$), and hydrocarbon gas, such as methane ($CH_4$), in accordance with the intended usage. Furthermore, the pressure of the reactive gas within the vacuum chamber 11 is set to about 1 Pa to 7 Pa. During the deposition process, the arc power source 15 applies a negative voltage of 10 V to 30 V between the target 2 and the anode 17, and the bias power source 16 applies a negative voltage of 10 V to 200 V between the anode 17 and the substrate 6, so that electric discharge is generated from the target 2, thereby producing a flow of an arc current of 100 A to 200 A.

First Embodiment

The first embodiment using the evaporation source 1 according to the present invention will now be described.

In this embodiment, the rear surface magnet 4 is formed of a disk-shaped (cylindrical) permanent magnet (referred to as "disk-shaped rear surface magnet 4A (first permanent magnet)" hereinafter). Specifically, the shape of a projection (referred to as "projection shape" hereinafter) obtained by projecting the disk-shaped rear surface magnet 4A in a direction normal to the surface thereof is similar to the projection shape of the target 2. Furthermore, since the disk-shaped rear surface magnet 4A is disposed coaxially with the target 2 and is formed of a neodymium magnet having high magnetic coercivity, the entire magnetic-field generating means 7 can be made compact.

The diameter of the target 2 is 100 mm, and the thickness of the target 2 is 16 mm. The target 2 is composed of titanium aluminide (TiAl) in which the atomic ratio between titanium (Ti) and aluminum (Al) is 1:1.

The outer diameter of the outer circumferential magnet 3 is 170 mm, and the inner diameter of the outer circumferential magnet 3 is 150 mm. The thickness of the outer circumferential magnet 3 is 10 mm.

In the first embodiment, the reactive gas is nitrogen ($N_2$), and the pressure of the reactive gas is 4 Pa. A deposition time is set to 30 minutes. By using the arc power source 15 to generate electric discharge from the target 2, an electric current of 150 A is applied. The bias power source 16 is used to apply a negative voltage of 30 V between the substrate 6 and the anode 17. The substrate 6 is a 15 mm×15 mm×5 mm mirror-polished cemented carbide chip. The substrate 6 is disposed at a position away from the surface of the target 2 by about 180 mm. The temperature of the substrate 6 is set at 500° C.

Figure 5:
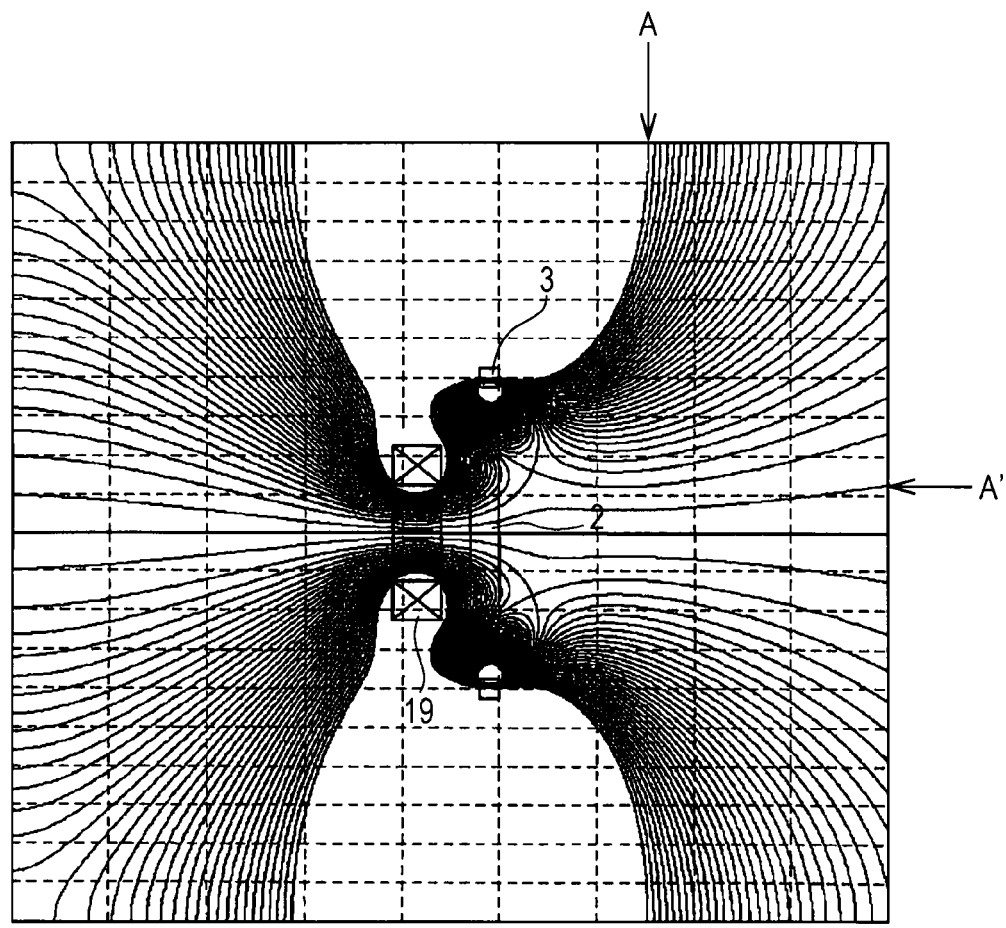
FIG. 5 is a distribution diagram of magnetic lines of force in an arc evaporation source according to a comparative technique (comparative measurement example 1).

The comparative technique shown in FIG. 5 (defined as a comparative measurement example 1) has similar conditions with regard to the target 2, the outer circumferential magnet 3, the arc current value, the reactive gas, the deposition time, the applied negative voltage, and the substrate 6, except that an electromagnetic coil 19 is disposed at the rear side of the target 2. A value obtained by multiplying an electric current value applied to the electromagnetic coil 19 by the number of turns in the electromagnetic coil 19 is 2000 A·T.

A measurement example 2 is a comparative measurement example in the related art that does not have the rear surface magnet 4.

In measurement examples 3 to 8, the disk-shaped rear surface magnet 4A is given different shapes (diameters and thicknesses), the disk-shaped rear surface magnet 4A is disposed at different positions (i.e., different distances from the surface of the target 2 to the surface of the disk-shaped rear surface magnet 4A), or the number of disk-shaped rear surface magnets 4A is set to different values, and the deposition process is performed under the aforementioned conditions.

Table 1 shows the diameter of the disk-shaped rear surface magnet 4A, the thickness of the disk-shaped rear surface magnet 4A, the distance from the surface of the target 2, the number of rear surface magnets, the electric current value flowing through the substrate 6, and the evaluation of deposition rate in the measurement examples 1 and 2, which are comparative techniques, and the measurement examples 3 to 8 according to the first embodiment.

TABLE 1

| MEASUREMENT EXAMPLE | DIAMETER OF REAR SURFACE MAGNET (mm) | THICKNESS OF REAR SURFACE MAGNET (mm) | DISTANCE FROM SURFACE OF TARGET (mm) | NUMBER OF REAR SURFACE MAGNETS | ELECTRIC CURRENT VALUE FLOWING THROUGH SUBSTRATE (A) | EVALUATION OF DEPOSITION RATE | FILM RESIDUAL-STRESS VALUE (GPa) | EVALUATION OF FILM RESIDUAL-STRESS |
|---|---|---|---|---|---|---|---|---|
| 1 COMPARATIVE MEASUREMENT EXAMPLE | — | — | — | — | 1.1 | X | −2.11 | X |
| 2 COMPARATIVE MEASUREMENT EXAMPLE | — | — | — | — | 1.0 | X | −2.23 | X |
| 3 MEASUREMENT EXAMPLE ACCORDING TO PRESENT INVENTION | 40 | 50 | 90 | 1 | 1.7 | ○ | −0.67 | ○ |
| 4 MEASUREMENT EXAMPLE ACCORDING TO PRESENT INVENTION | 80 | 15 | 90 | 1 | 2.1 | ○ | −0.53 | ○ |
| 5 MEASUREMENT EXAMPLE ACCORDING TO PRESENT INVENTION | 100 | 3 | 40 | 1 | 1.7 | ○ | −0.61 | ○ |
| 6 MEASUREMENT EXAMPLE ACCORDING TO PRESENT INVENTION | 100 | 3 | 50 | 1 | 2.1 | ○ | −0.51 | ○ |

TABLE 1-continued

| MEASUREMENT EXAMPLE | DIAMETER OF REAR SURFACE MAGNET (mm) | THICKNESS OF REAR SURFACE MAGNET (mm) | DISTANCE FROM SURFACE OF TARGET (mm) | NUMBER OF REAR SURFACE MAGNETS | ELECTRIC CURRENT VALUE FLOWING THROUGH SUBSTRATE (A) | EVALUATION OF DEPOSITION RATE | FILM RESIDUAL-STRESS VALUE (GPa) | EVALUATION OF FILM RESIDUAL-STRESS |
|---|---|---|---|---|---|---|---|---|
| 7 MEASUREMENT EXAMPLE ACCORDING TO PRESENT INVENTION | 100 | 3 | 60 | 1 | 1.9 | ◯ | −0.57 | ◯ |
| 8 MEASUREMENT EXAMPLE ACCORDING TO PRESENT INVENTION | 100, 100 | 3, 3 | 50, 80 | 2 | 2.5 | ◯ | −0.31 | ◯ |

Next, the deposition rate on the substrate 6 and the evaluation of residual stress will be described.

Since the deposition rate is proportional to an ion current flowing through the substrate 6 due to an arc discharge, the deposition rate increases with increasing electric current value flowing through the substrate 6. Because an electric current value proportional to the deposition rate is desirably 1.5 A or higher in view of productivity and working efficiency, an acceptance criterion is satisfied when the electric current value is 1.5 A or higher.

With regard to residual stress of a thin film, a film is formed on a 1-mm-thick Si wafer, the radius of curvature of the substrate 6 in a warped state after the film formation is measured by utilizing an optical lever, and the residual stress of the thin film is calculated on the basis of Stoney formula shown below as a mathematical expression 1. Regarding the residual stress of the thin film, an acceptance criterion is satisfied when an absolute value of the residual stress is 2.0 GPa or lower based on the assumption that delamination of a hard anodic oxidation film for a cutting tool may occur.

$$\sigma_f = \frac{E_s t_s^2}{6R(1-v_s)t_f}$$ MATHEMATICAL EXPRESSION 1

In this mathematical expression 1, $\sigma_f$ denotes residual stress, $E_s$ denotes a Young's modulus of the substrate, $t_s$ denotes a thickness of the substrate, $v_s$ denotes a Poisson's ratio of the substrate, $t_f$ denotes a film thickness, and R denotes a radius of curvature of the substrate in a warped state.

First, a distribution diagram of magnetic lines of force in each measurement example will be examined.

Figure 6:
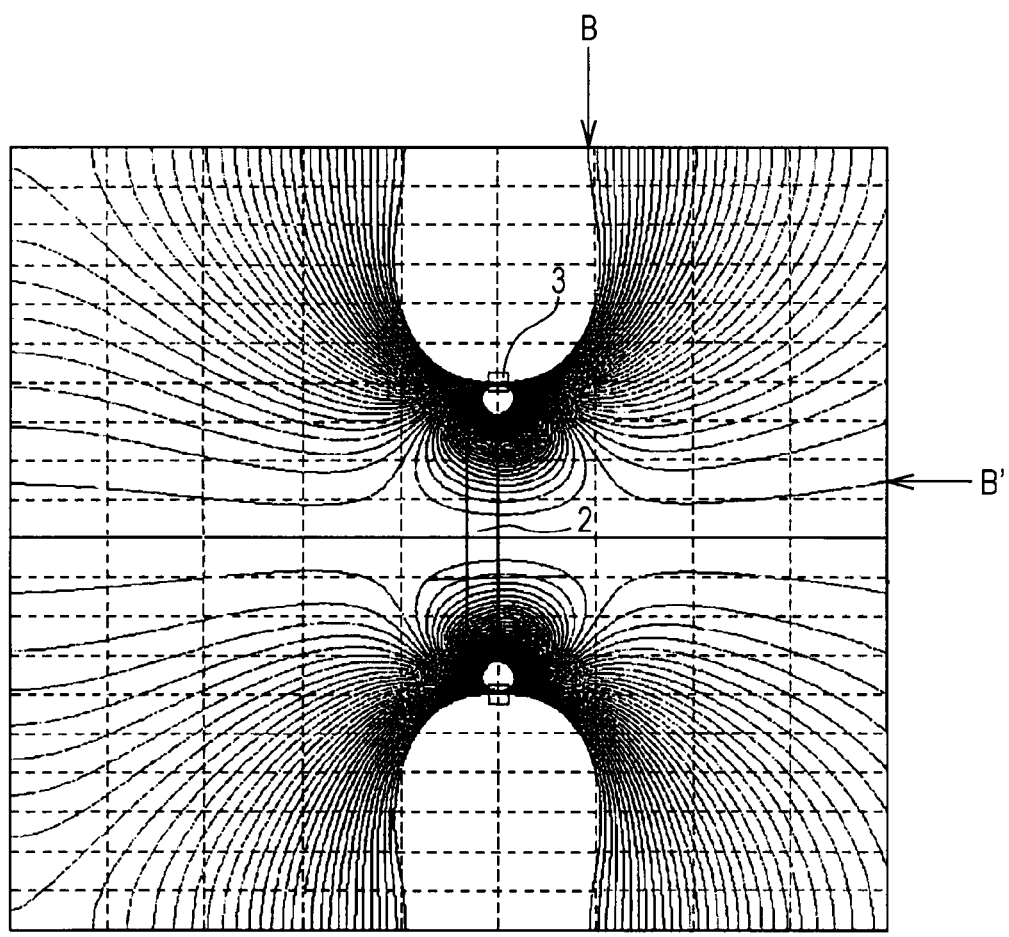
FIG. 6 is a distribution diagram of magnetic lines of force in an arc evaporation source according to a comparative measurement example 2.

FIG. 5 is a distribution diagram of magnetic lines of force in the measurement example 1, and FIG. 6 is a distribution diagram of magnetic lines of force in the measurement example 2. As shown in FIGS. 5 and 6, in the measurement examples 1 and 2, magnetic lines of force extending forward from the target 2 significantly diverge from the front direction of the target 2 (i.e., the direction toward the substrate 6).

Specifically, in the measurement example 1, magnetic lines of force that are the farthest from the axis of the target 2 are already distant from the axis of the target 2 by 200 mm even though the magnetic lines of force have only proceeded to a point located about 75 mm toward the substrate 6 from the surface of the target 2, meaning that these magnetic lines of force have diverged significantly (see arrow A in FIG. 5).

In the measurement example 2, magnetic lines of force that are the farthest from the axis of the target 2 have already diverged from the axis of the target 2 by 200 mm even though the magnetic lines of force have only proceeded to a point located about 45 mm toward the substrate 6 from the surface of the target 2 (see arrow B in FIG. 6).

Since the magnetic lines of force extending forward from the target 2 significantly diverge from the direction toward the substrate 6 in this manner, an ion trajectory also tends to diverge from the direction toward the substrate 6.

As a result, as shown in Table 1, electric current values flowing through the substrate 6 in the measurement examples 1 and 2 are 1.1 A and 1.0 A, respectively, and the evaluation results for the deposition rate fail to satisfy the acceptance criterion, meaning that an efficient deposition process is difficult. Moreover, the deposition rate is reduced due to the significant divergence of the ion trajectory from the substrate 6. Therefore, as shown in Table 1, film residual-stress values in the measurement examples 1 and 2 are −2.11 GPa and −2.23 GPa, respectively, and the evaluation results for film residual-stress fail to satisfy the acceptance criterion, meaning that a film with low film residual-stress cannot be formed.

Figure 7:
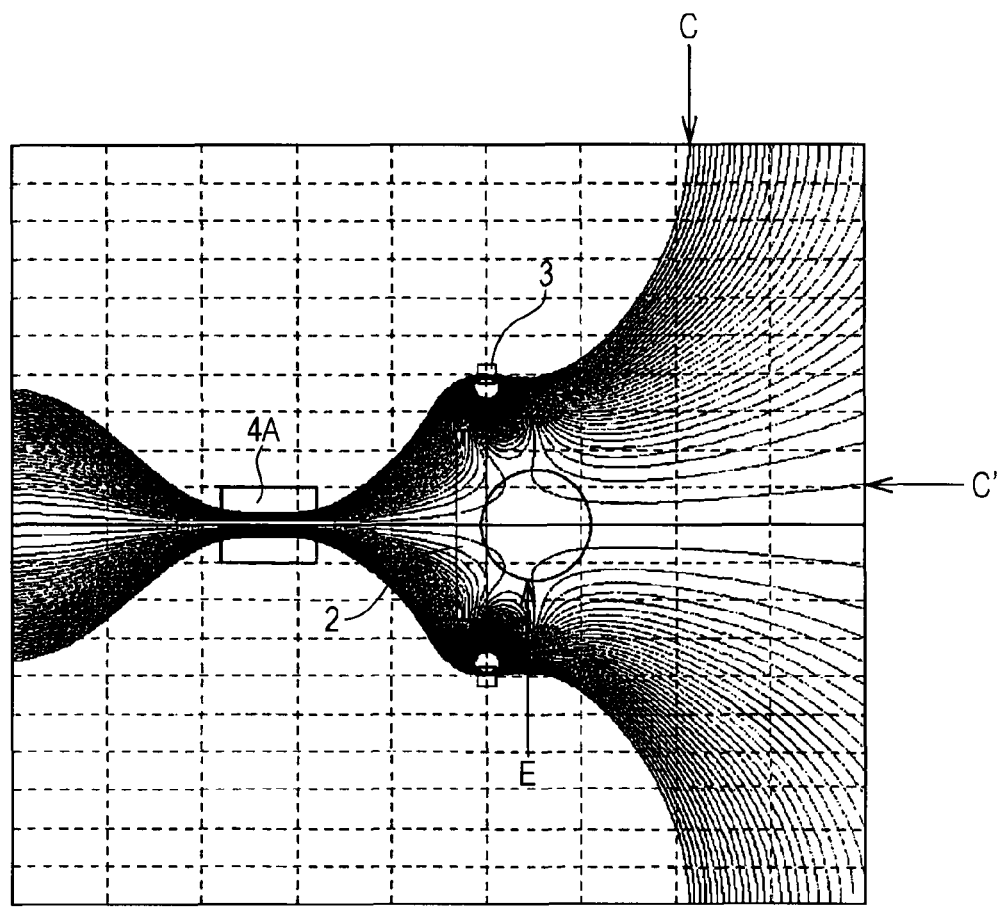
FIG. 7 is a distribution diagram of magnetic lines of force in an arc evaporation source in a measurement example 3 according to the first embodiment of the present invention.
Figure 8:
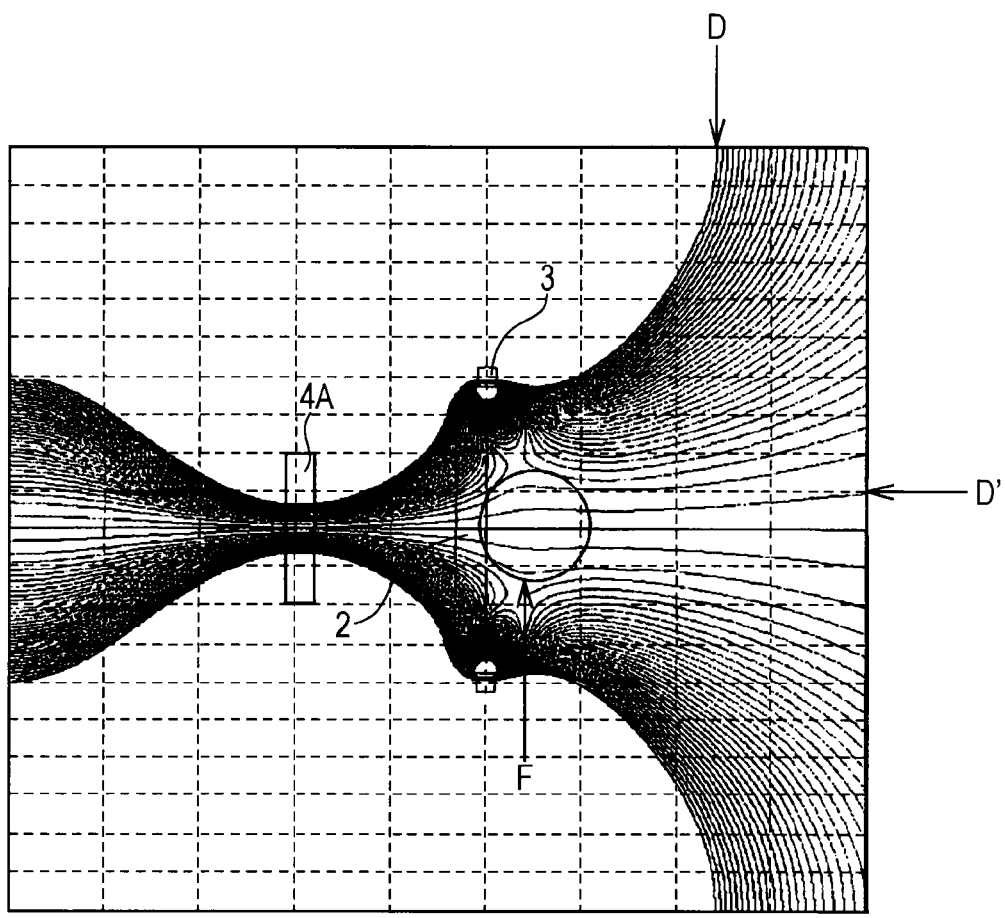
FIG. 8 is a distribution diagram of magnetic lines of force in an arc evaporation source according to a measurement example 4.
Figure 9:
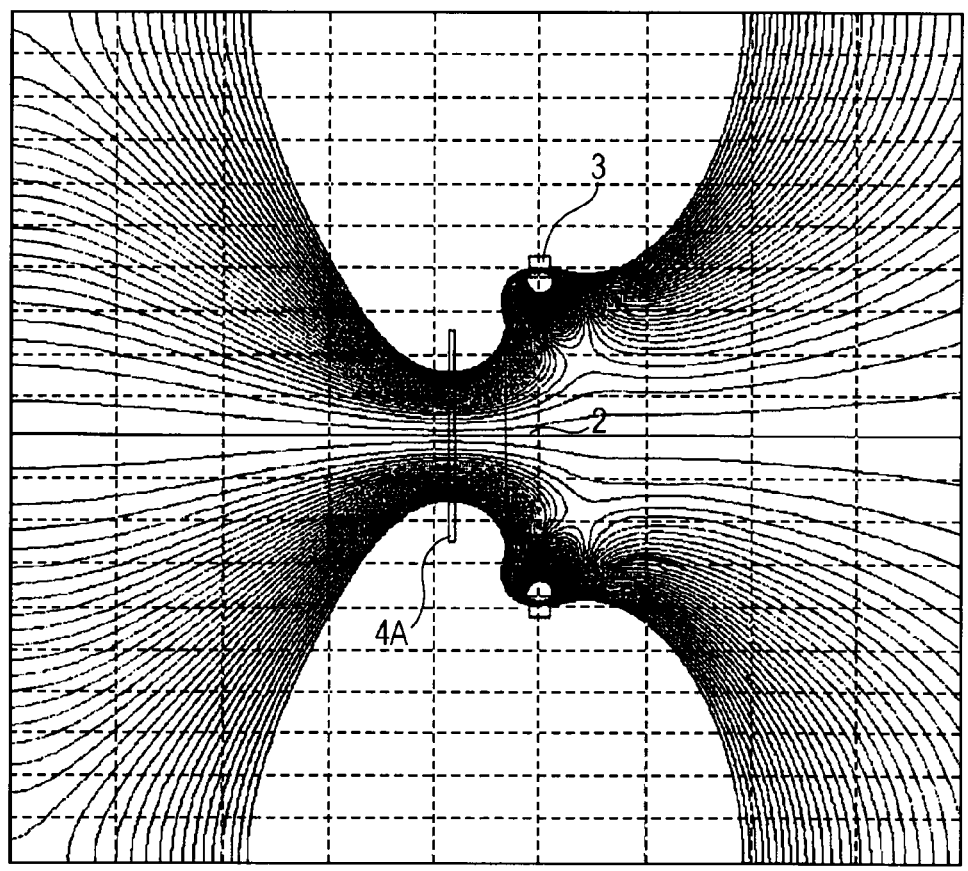
FIG. 9 is a distribution diagram of magnetic lines of force in an arc evaporation source according to a measurement example 5.
Figure 10:
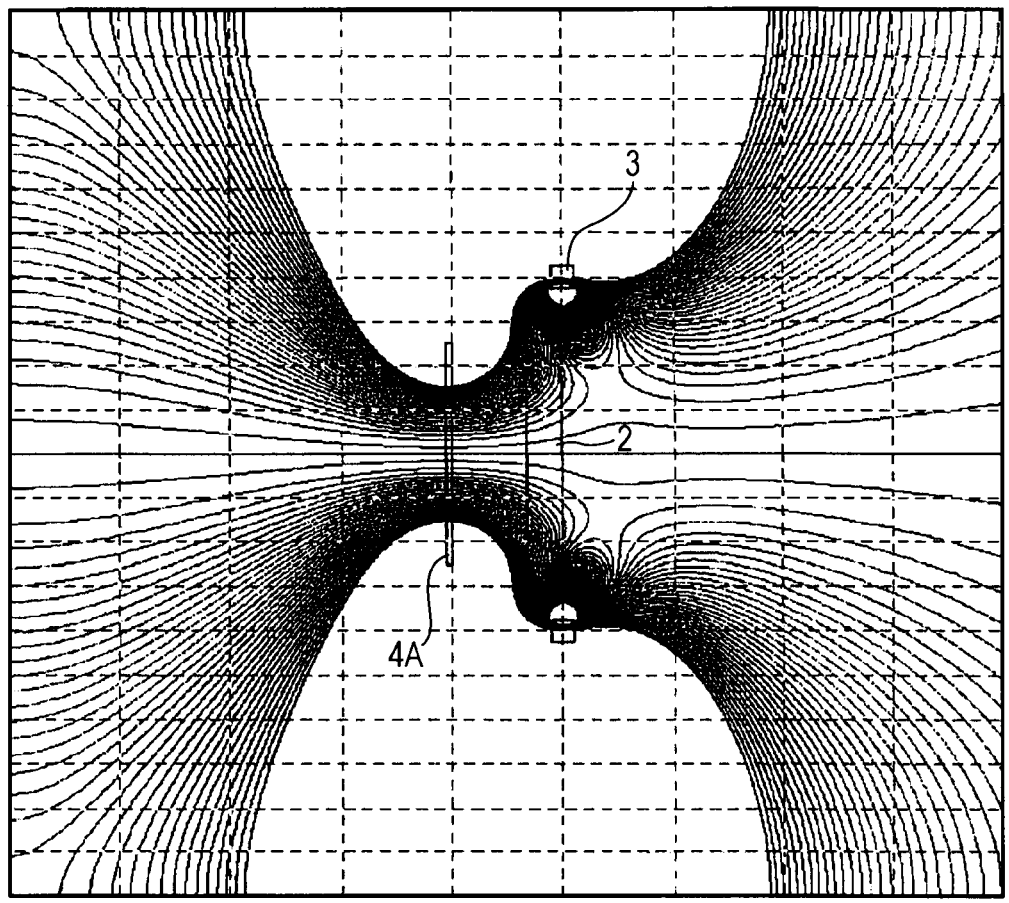
FIG. 10 is a distribution diagram of magnetic lines of force in an arc evaporation source according to a measurement example 6.
Figure 11:
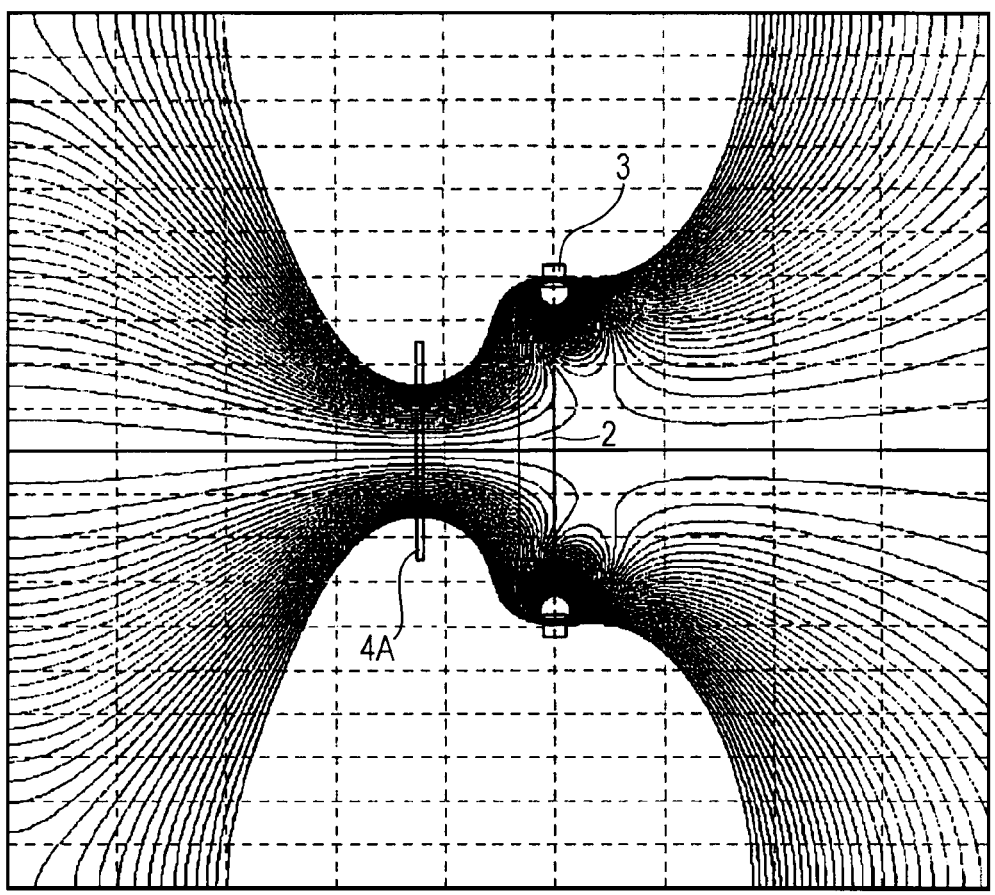
FIG. 11 is a distribution diagram of magnetic lines of force in an arc evaporation source according to a measurement example 7.
Figure 12:
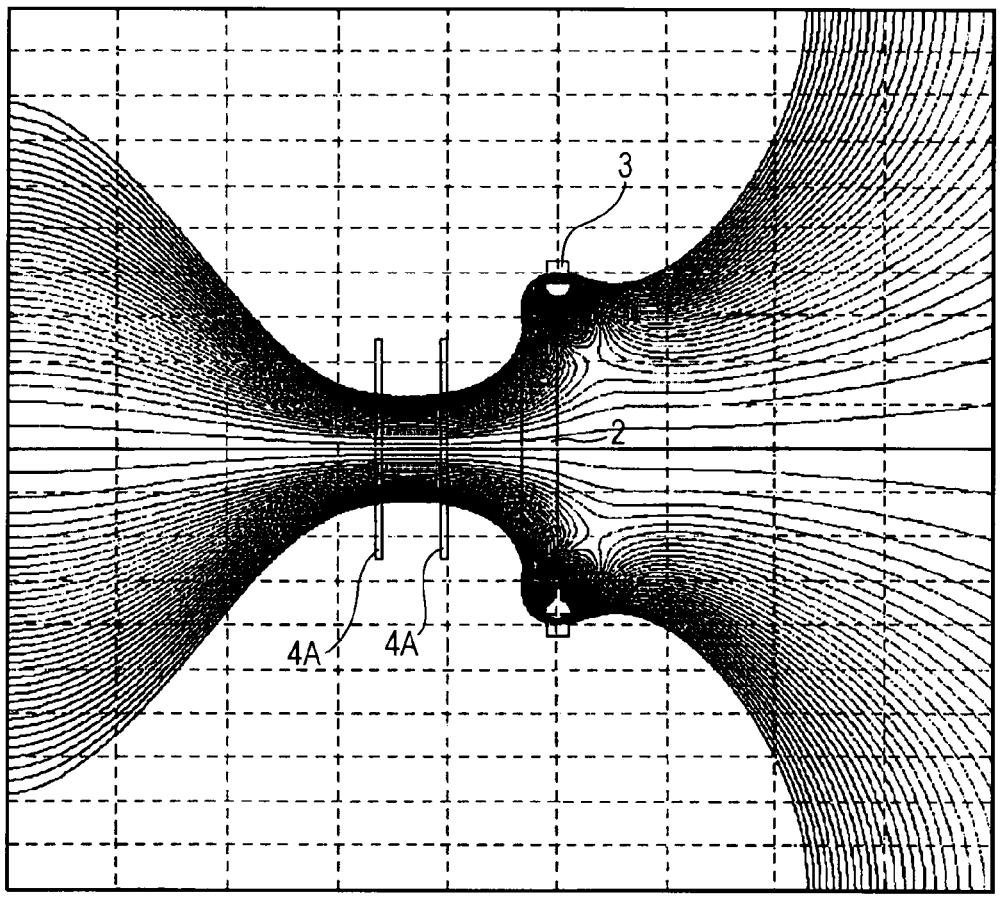
FIG. 12 is a distribution diagram of magnetic lines of force in an arc evaporation source according to a measurement example 8.

FIG. 7 is a distribution diagram of magnetic lines of force in the measurement example 3, FIG. 8 is a distribution diagram of magnetic lines of force in the measurement example 4, FIG. 9 is a distribution diagram of magnetic lines of force in the measurement example 5, FIG. 10 is a distribution diagram of magnetic lines of force in the measurement example 6, FIG. 11 is a distribution diagram of magnetic lines of force in the measurement example 7, and FIG. 12 is a distribution diagram of magnetic lines of force in the measurement example 8. It is apparent from these drawings that the magnetic lines of force can be induced toward the substrate 6 in the measurement examples 3 to 8.

Specifically, in the measurement examples 3 to 8, magnetic lines of force that are the farthest from the axis of the target 2 do not become distant from the axis of the target 2 by 200 mm or more until the magnetic lines of force proceed to a point located about 90 mm to 120 mm toward the substrate 6 from the surface of the target 2 (for example, see arrow C in FIG. 7 and arrow D in FIG. 8), whereby a larger number of magnetic lines of force extend from the target 2 toward the substrate 6.

In the measurement examples 3 to 8, there are components of magnetic lines of force that extend directly toward the substrate 6 from near the center of the target 2 (for example, see arrow E in FIG. 7 and arrow F in FIG. 8). Furthermore, in the measurement examples 3 to 8, magnetic lines of force that are the closest to the axis of the target 2 are only distant from the axis of the target 2 by about 20 mm even when the magnetic lines of force have proceeded to a point located about 200 mm toward the substrate 6 from the surface of the target 2 (for example, see arrow C' in FIG. 7 and arrow D' in FIG. 8), whereby a larger number of magnetic lines of force directly extend toward the substrate 6, as compared with the measurement examples 1 and 2 in which the magnetic lines of force at the same point are distant from the axis of the target 2 by about 24 mm or more (see arrow A' in FIG. 5 and arrow B' in FIG. 6).

As a result, as shown in Table 1, the electric current values flowing through the substrate 6 in the measurement examples 3 to 8 are 1.5 A or higher, whereby the evaluation results for the deposition rate satisfy the acceptance criterion. Therefore, in the measurement examples 3 to 8, the deposition rate is higher than that in the measurement examples 1 and 2, thereby allowing for an efficient deposition process. Moreover, since the absolute values for film residual-stress in the measurement examples 3 to 8 are 2.0 GPa or lower, the evaluation results for film residual-stress satisfy the acceptance criterion, thereby allowing for formation of a film with low film residual-stress.

The measurement examples 3 and 4 will now be compared.

The diameter of the disk-shaped rear surface magnet 4A in the measurement example 3 is 40 mm, and the area of the surface of the disk-shaped rear surface magnet 4A that faces the target 2 (simply referred to as "surface" hereinafter) is $400\pi$ mm$^2$. Therefore, the area of the surface of the disk-shaped rear surface magnet 4A is equal to 0.16 times ($16/100$) the area of the surface of the target 2, which is $2500\pi$ mm$^2$.

The diameter of the disk-shaped rear surface magnet 4A in the measurement example 4 is 80 mm, and the area of the surface of the disk-shaped rear surface magnet 4A is $1600\pi$ mm$^2$. Therefore, the area of the surface of the disk-shaped rear surface magnet 4A is equal to 0.64 times ($64/100$) the area of the surface of the target 2, which is $2500\pi$ mm$^2$.

As shown in FIGS. 7 and 8 and Table 1, the distribution diagram of magnetic lines of force in the measurement example 4 shows a larger number of magnetic lines of force extending toward the substrate 6, as compared with the distribution diagram of magnetic lines of force in the measurement example 3, and the electric current value flowing through the substrate 6 in the measurement example 4 is higher than that in the measurement example 3, making it apparent that the deposition rate in the measurement example 4 is higher than that in the measurement example 3.

Accordingly, when the area of the surface of the disk-shaped rear surface magnet 4A is larger than or equal to 0.25 times (¼) the area of the surface of the target 2, a larger number of magnetic lines of force extend directly toward the substrate 6 without diverging from the axis of the target 2, whereby ions evaporated from the target 2 can be induced to the substrate 6 more efficiently.

The area of the surface of the disk-shaped rear surface magnet 4A is preferably equal to 0.64 times ($64/100$) the area of the surface of the target 2, and is more preferably larger than or equal to the area of the surface of the target 2 (that is, 1.0 times the area of the surface of the target 2). Furthermore, an upper limit for the diameter of the disk-shaped rear surface magnet 4A is preferably equal to 1.5 times the diameter of the target 2, meaning that an upper limit for the area of the surface of the disk-shaped rear surface magnet 4A is preferably equal to 2.25 times (9/4) the area of the surface of the target 2.

The measurement examples 5 to 7 will now be compared.

Although the disk-shaped rear surface magnet 4A has the same diameter and the same thickness, the distance from the surface of the target 2 to the surface of the disk-shaped rear surface magnet 4A is different. Specifically, the distance from the surface of the target 2 in the measurement example 5 is 40 mm, the distance from the surface of the target 2 in the measurement example 6 is 50 mm, and the distance from the surface of the target 2 in the measurement example 7 is 60 mm.

As shown in Table 1, the differences in the distance leads to results in which the electric current value flowing through the substrate 6 in the measurement example 6 is higher than that in the measurement examples 5 and 7, the deposition rate in the measurement example 6 is higher than that in the measurement examples 5 and 7, and the film residual-stress in the measurement example 6 is smaller than that in the measurement examples 5 and 7.

This is because an arc discharge receives a force that moves in a direction normal to (i.e., the direction toward the substrate 6) components of magnetic lines of force acting in a direction parallel with the surface of the target 2 (referred to as "parallel components" hereinafter) and the moving rate of an arc spot is proportional to the strength of the parallel components of magnetic lines of force. The parallel components of magnetic lines of force increase in strength at a point where components of magnetic lines of force that are perpendicular to the surface of the target 2 (referred to as "perpendicular components" hereinafter) become zero (including a value in the vicinity of zero, and the same applies hereinafter). Furthermore, an arc discharge tends to occur by priority at the point where the perpendicular components of magnetic lines of force become zero. Although this point where the perpendicular components become zero is determined on the basis of the distance from the surface of the target 2 to the surface of the disk-shaped rear surface magnet 4A, an arc discharge tends to occur around the outer periphery when the distance is small; although ions are generated at the outer side, the point where the perpendicular components of magnetic lines of force become zero is shifted toward the center as the distance is increased, whereby the ions can efficiently reach the substrate 6. However, in the case where the distance is too large, the magnetic lines of force on the surface of the target 2 and the magnetic lines of force extending toward the substrate 6 weaken and lose the ability to efficiently carry ions. Therefore, it can be considered that the measurement example 6 achieves the highest deposition rate and the lowest film residual stress.

In order to set the perpendicular components to zero and change the positions of magnetic lines of force only having parallel components, a mechanism for moving the disk-shaped rear surface magnet 4A toward and away from the target 2 in the front-rear direction may be incorporated. By changing the distance from the surface of the target 2 to the disk-shaped rear surface magnet 4A in this manner, the strength of the parallel components of magnetic lines of force can be adjusted, and the point at which the perpendicular components of the magnetic lines of force become zero can be controlled.

The measurement example 8 is similar to the measurement example 6 in that the disk-shaped rear surface magnet 4A (first permanent magnet) having a diameter of 100 mm and a thickness of 3 mm is disposed at a distance of 50 mm from the surface of the target 2, but is different in that another disk-shaped rear surface magnet 4A (second permanent magnet) having the same shape and the same diameter is coaxially disposed behind the aforementioned disk-shaped rear surface magnet 4A.

Thus, the rectilinear properties of the magnetic lines of force generated from the disk-shaped rear surface magnet 4A (first permanent magnet) disposed at the rear side are further improved, whereby a larger number of magnetic lines of force directly extend toward the substrate 6. Therefore, an electric current value flowing through the substrate 6 in the measurement example 8 is higher than that in the measurement example 6, the deposition rate in the measurement example 8 is higher than that in the measurement example 6, and the film residual-stress in the measurement example 8 can be reduced relative to the measurement example 6.

Second Embodiment

Another embodiment using the evaporation source 1 according to the present invention will now be described.

The second embodiment is an example in which a ring-shaped permanent magnet (referred to as "ring-shaped rear surface magnet 4B (ring-shaped permanent magnet)" hereinafter) is disposed as the rear surface magnet 4, and in which a magnet is not provided within the ring-shaped rear surface magnet 4B (i.e., in a region surrounded by the inner peripheral surface of the ring-shaped rear surface magnet 4B). The projection shape of the outer periphery and the inner periphery of the ring-shaped rear surface magnet 4B is similar to the projection shape of the target 2. The ring-shaped rear surface magnet 4B is disposed coaxially with the target 2 and is formed of a neodymium magnet having high magnetic coercivity, so that the entire magnetic-field generating means 7 can be made compact.

The outer diameter and the inner diameter of the ring-shaped rear surface magnet 4 vary among measurement examples. The thickness of the ring-shaped rear surface magnet 4B is 20 mm, the distance from the surface of the target 2 to the surface of the ring-shaped rear surface magnet 4B is 30 mm, and the thickness and the distance are the same among the measurement examples. Other conditions are similar to those in the first embodiment. In a measurement example 9, the outer diameter of the ring-shaped rear surface magnet 4B is 40 mm, and the inner diameter of the ring-shaped rear surface magnet 4B is 20 mm. In a measurement example 10, the outer diameter of the ring-shaped rear surface magnet 4B is 170 mm, and the inner diameter of the ring-shaped rear surface magnet 4B is 150 mm. In the measurement example 10, the outer circumferential magnet 3 and the ring-shaped rear surface magnet 4B are disposed coaxially with each other, and the outer circumferential magnet 3 and the ring-shaped rear surface magnet 4B have the same inner diameter and the same outer diameter.

Table 2 shows the outer diameter, the inner diameter, and the thickness of the ring-shaped rear surface magnet 4B, the distance from the surface of the target 2, the number of ring-shaped rear surface magnets, the electric current value flowing through the substrate 6, the evaluation of deposition rate, the film residual-stress value, and the evaluation of film residual-stress in the measurement examples 2 and 9, which are comparative techniques, and the measurement example 10 according to the second embodiment.

TABLE 2

| MEASUREMENT EXAMPLE | OUTER DIAMETER OF REAR SURFACE MAGNET (mm) | INNER DIAMETER OF REAR SURFACE MAGNET (mm) | THICKNESS OF REAR SURFACE MAGNET (mm) | DISTANCE FROM SURFACE OF TARGET (mm) | NUMBER OF REAR SURFACE MAGNETS | ELECTRIC CURRENT VALUE FLOWING THROUGH SUBSTRATE (A) | EVALUATION OF DEPOSITION RATE | FILM RESIDUAL-STRESS VALUE (GPa) | EVALUATION OF FILM RESIDUAL-STRESS |
|---|---|---|---|---|---|---|---|---|---|
| 2 COMPARATIVE MEASUREMENT EXAMPLE | — | — | — | — | — | 1.0 | X | −2.1 | X |
| 9 COMPARATIVE MEASUREMENT EXAMPLE | 40 | 20 | 20 | 30 | 1 | 1.0 | X | −2.2 | X |
| 10 MEASUREMENT EXAMPLE ACCORDING TO PRESENT INVENTION | 170 | 150 | 20 | 30 | 1 | 2.9 | ○ | −1.3 | ○ |

As described above, in the measurement example 2, the evaluation result for the deposition rate fails to satisfy the acceptance criterion since the electric current value flowing through the substrate 6 is 1.0 A, and the deposition rate is thus low. In the measurement example 9, which is a comparative technique relative to the present invention, projections of the ring-shaped rear surface magnet 4B and the target 2 obtained by projecting the ring-shaped rear surface magnet 4B and the target 2 in a direction normal to the evaporation surface of the target 2 overlap each other. In other words, in the measurement example 9, the inner diameter of the ring-shaped rear surface magnet 4B disposed at the rear side of the target 2 is small and is outside the technical scope of the present invention. Because the number of magnetic lines of force induced to the substrate 6 is small in the measurement example 9, it is not possible to efficiently converge the ions, and the electric current value flowing through the substrate 6 is smaller than 1.5 A, meaning that the evaluation result for the deposition rate fails to satisfy the acceptance criterion.

On the other hand, in the measurement example 10, the projections of the ring-shaped rear surface magnet 4B and the target 2 obtained by projecting the ring-shaped rear surface magnet 4B and the target 2 in the direction normal to the evaporation surface of the target 2 do not overlap each other. In other words, in the measurement example 10, the inner diameter of the ring-shaped rear surface magnet 4B is larger than the outer diameter of the target 2. In the measurement example 10, the magnetic lines of force extend from the target 2 toward the substrate 6 and can efficiently carry ions to the substrate 6 so that the evaluation result for the deposition rate satisfies the acceptance criterion, thus achieving a higher deposition rate as compared with the measurement example 2 (see Table 2). Moreover, the evaluation result for the film residual-stress satisfies the acceptance criterion, thereby allowing for formation of a film with low film residual-stress.

Figure 13:
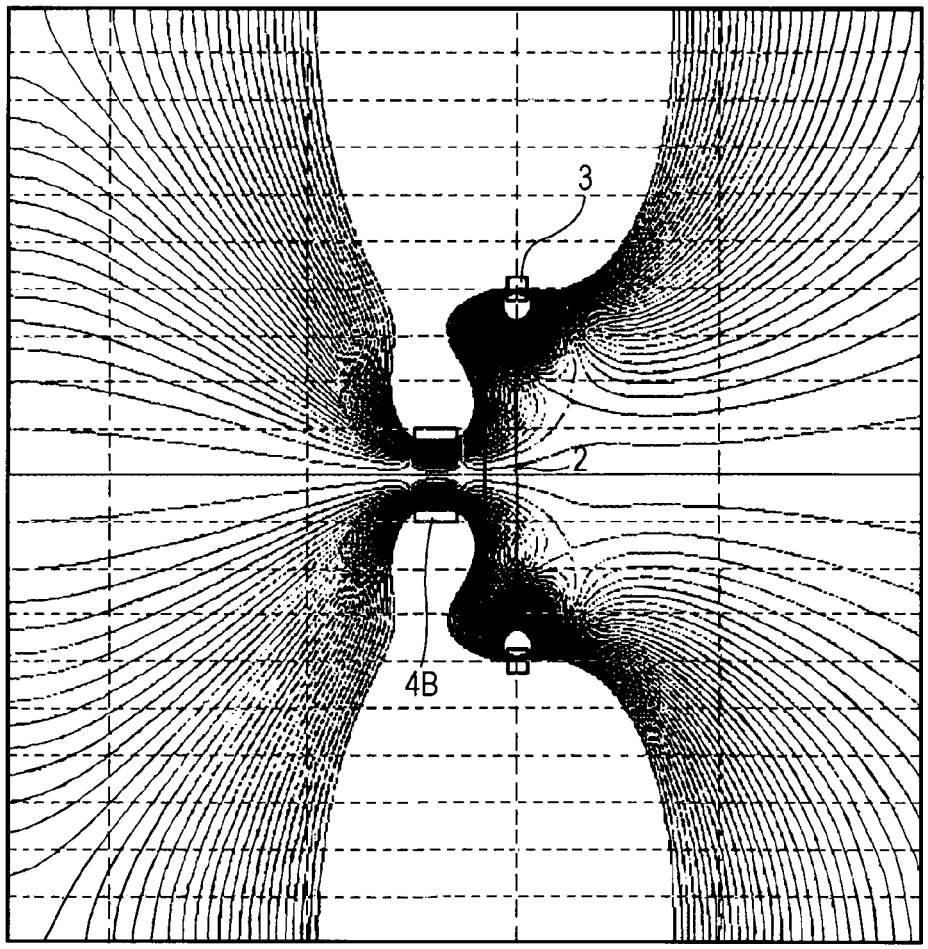
FIG. 13 is a distribution diagram of magnetic lines of force in an arc evaporation source according to a comparative measurement example 9.
Figure 14:
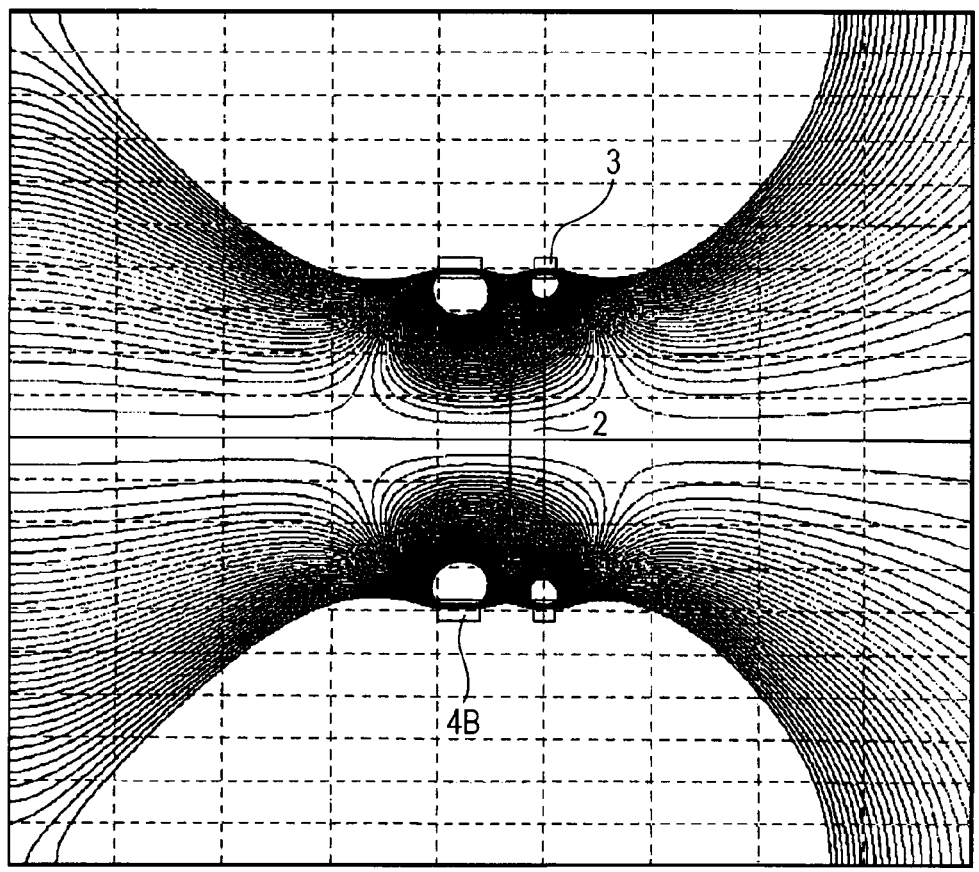
FIG. 14 is a distribution diagram of magnetic lines of force in an arc evaporation source in a measurement example 10 according to the second embodiment of the present invention.

FIG. 13 is a distribution diagram of magnetic lines of force in an arc evaporation source according to the measurement example 9, and FIG. 14 is a distribution diagram of magnetic lines of force in an arc evaporation source in the measurement example 10 according to the second embodiment. It is apparent from these drawings that the magnetic lines of force tend to extend toward the substrate 6 as the outer diameter of the ring-shaped rear surface magnet 4B increases.

Third Embodiment

In the third embodiment, the disk-shaped rear surface magnet 4A, which is a first permanent magnet, and the ring-shaped rear surface magnet 4B (ring-shaped permanent magnet), which is a ring-shaped permanent magnet, are simultaneously used as the rear surface magnet 4. The disk-shaped rear surface magnet 4A and the ring-shaped rear surface magnet 4B are disposed coaxially with the target 2. The disk-shaped rear surface magnet 4A is disposed within the ring-shaped rear surface magnet 4B (i.e., in a region surrounded by the inner peripheral surface of the ring-shaped rear surface magnet 4B). The polarities of the outer circumferential magnet 3, the disk-shaped rear surface magnet 4A, and the ring-shaped rear surface magnet 4B are oriented in the same direction.

The shape (diameter, outer diameter, inner diameter, and thickness) of the disk-shaped rear surface magnet 4A and the ring-shaped rear surface magnet 4B and the distance from the surface of the target 2 vary among measurement examples. Other conditions are similar to those in the first embodiment.

The ring-shaped rear surface magnet 4B in the third embodiment is formed by arranging a plurality of cylindrical permanent magnets in the form of a ring such that the cylindrical permanent magnets surround the disk-shaped rear surface magnet 4A at the rear side of the target 2.

A measurement example 11 and a measurement example 12 are similar to each other in that the disk-shaped rear surface magnet 4A of the same shape is used, but differ from each other in terms of the thickness of the ring-shaped rear surface magnet 4B and the distance from the surface of the target 2.

The measurement example 12 and a measurement example 15 are similar to each other in that the ring-shaped rear surface magnet 4B and the disk-shaped rear surface magnet 4A of the same shape (position) are used, but differ from each other in terms of the distances of the disk-shaped rear surface magnet 4A and the ring-shaped rear surface magnet 4B from the surface of the target 2.

A measurement example 13 and a measurement example 14 are similar to each other in that the ring-shaped rear surface magnet 4B and the disk-shaped rear surface magnet 4A of the same shape (position) are used and that the distance from the surface of the target 2 to the ring-shaped rear surface magnet 4B is the same, but differ from each other in terms of the diameter and the thickness of the disk-shaped rear surface magnet 4A.

In the measurement examples 11 to 15, the outer circumferential magnet 3 and the ring-shaped rear surface magnet 4B have the same inner diameter and the same outer diameter.

Table 3 shows the shape of the two rear surface magnets 4, the distances thereof from the surface of the target 2, the number of rear surface magnets, the electric current value flowing through the substrate 6, the evaluation of deposition rate, the film residual-stress value, and the evaluation of film residual-stress in measurement examples 12 to 16 in the third embodiment.

TABLE 3

| MEASUREMENT EXAMPLE | DIAMETER OF DISK-SHAPED REAR SURFACE MAGNET (mm) | THICKNESS OF DISK-SHAPED REAR SURFACE MAGNET (mm) | DISTANCE FROM SURFACE OF TARGET TO DISK-SHAPED REAR SURFACE MAGNET (mm) | OUTER DIAMETER OF RING-SHAPED REAR SURFACE MAGNET (mm) | INNER DIAMETER OF RING-SHAPED REAR SURFACE MAGNET (mm) | THICKNESS OF RING-SHAPED REAR SURFACE MAGNET (mm) |
|---|---|---|---|---|---|---|
| 11 MEASUREMENT EXAMPLE ACCORDING TO PRESENT INVENTION | 100 | 3 | 40 | 170 | 150 | 10 |
| 12 MEASUREMENT EXAMPLE ACCORDING TO PRESENT INVENTION | 100 | 3 | 40 | 170 | 150 | 20 |
| 13 MEASUREMENT EXAMPLE ACCORDING TO PRESENT INVENTION | 50 | 10 | 40 | 170 | 150 | 20 |
| 14 MEASUREMENT EXAMPLE ACCORDING TO PRESENT INVENTION | 25 | 24 | 40 | 170 | 150 | 20 |
| 15 MEASUREMENT EXAMPLE ACCORDING TO PRESENT INVENTION | 100 | 3 | 50 | 170 | 150 | 20 |

TABLE 3-continued

| MEASUREMENT EXAMPLE | DISTANCE FROM SURFACE OF TARGET TO RING-SHAPED REAR SURFACE MAGNET (mm) | NUMBER OF REAR SURFACE MAGNETS | ELECTRIC CURRENT VALUE FLOWING THROUGH SUBSTRATE (A) | EVALUATION OF DEPOSITION RATE | FILM RESIDUAL-STRESS VALUE (GPa) | EVALUATION OF FILM RESIDUAL-STRESS |
|---|---|---|---|---|---|---|
| 11 MEASUREMENT EXAMPLE ACCORDING TO PRESENT INVENTION | 40 | 2 | 2.7 | ○ | −0.25 | ○ |
| 12 MEASUREMENT EXAMPLE ACCORDING TO PRESENT INVENTION | 30 | 2 | 3.1 | ○ | −0.19 | ○ |
| 13 MEASUREMENT EXAMPLE ACCORDING TO PRESENT INVENTION | 30 | 2 | 2.9 | ○ | −0.22 | ○ |
| 14 MEASUREMENT EXAMPLE ACCORDING TO PRESENT INVENTION | 30 | 2 | 2.4 | ○ | −0.33 | ○ |
| 15 MEASUREMENT EXAMPLE ACCORDING TO PRESENT INVENTION | 50 | 2 | 3.3 | ○ | −0.15 | ○ |

Figure 15:
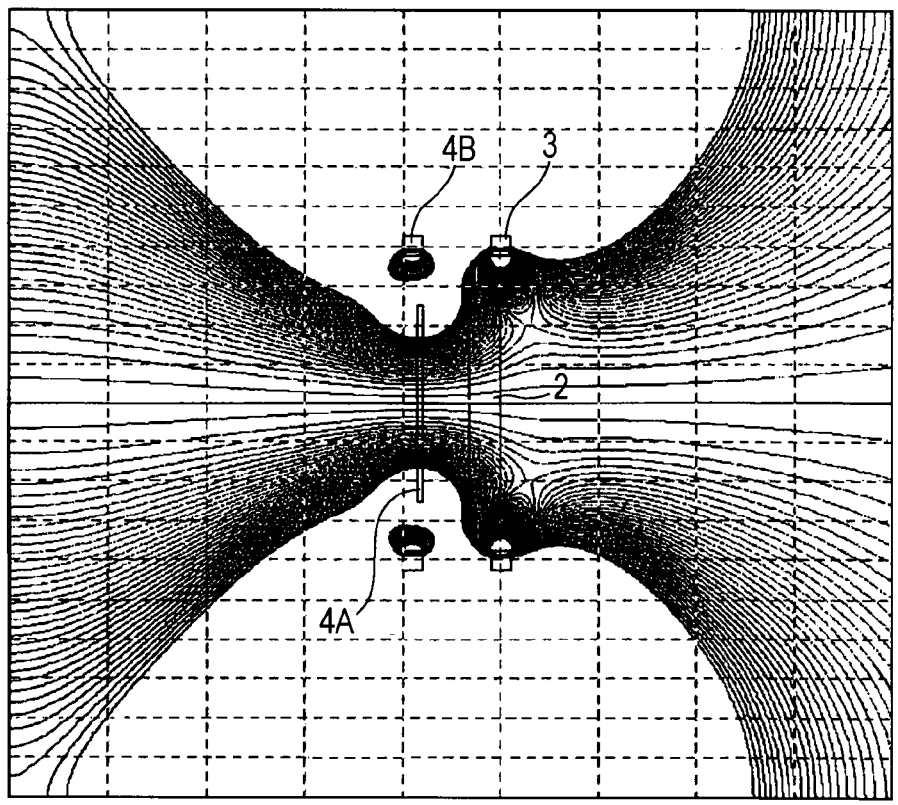
FIG. 15 is a distribution diagram of magnetic lines of force in an arc evaporation source in a measurement example 11 according to the third embodiment of the present invention.
Figure 16:
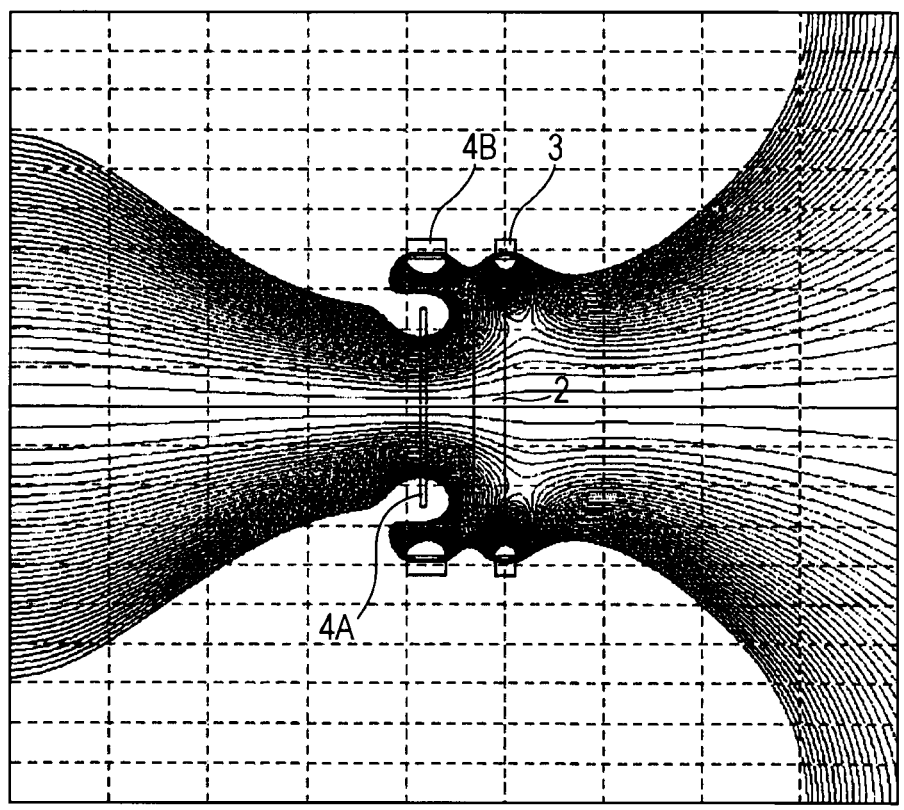
FIG. 16 is a distribution diagram of magnetic lines of force in an arc evaporation source according to a measurement example 12.
Figure 17:
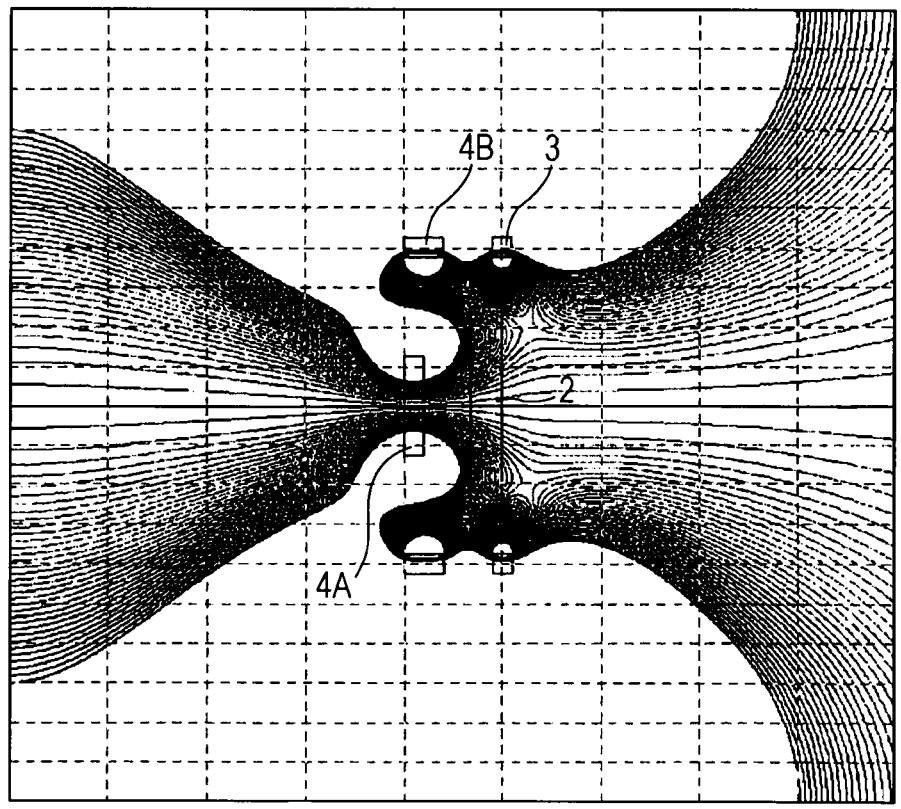
FIG. 17 is a distribution diagram of magnetic lines of force in an arc evaporation source according to a measurement example 13.
Figure 18:
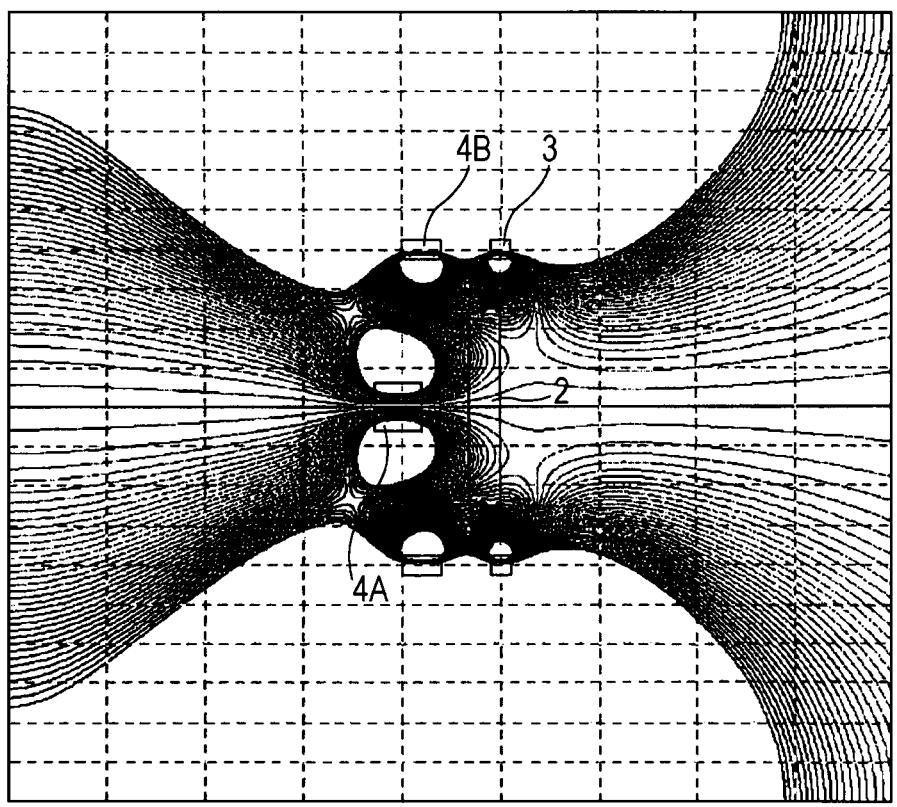
FIG. 18 is a distribution diagram of magnetic lines of force in an arc evaporation source according to a measurement example 14.
Figure 19:
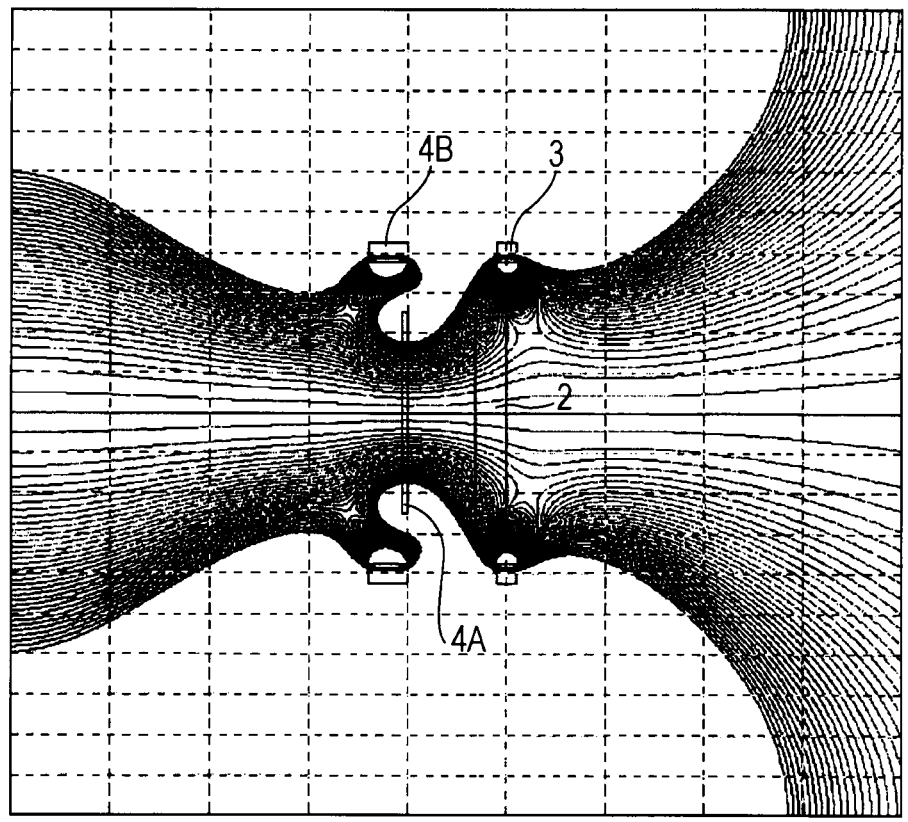
FIG. 19 is a distribution diagram of magnetic lines of force in an arc evaporation source according to a measurement example 15.

FIG. 15 is a distribution diagram of magnetic lines of force in an arc evaporation source according to the measurement example 11, FIG. 16 is a distribution diagram of magnetic lines of force in an arc evaporation source according to the measurement example 12, FIG. 17 is a distribution diagram of magnetic lines of force in an arc evaporation source according to the measurement example 13, FIG. 18 is a distribution diagram of magnetic lines of force in an arc evaporation source according to the measurement example 14, and FIG. 19 is a distribution diagram of magnetic lines of force in an arc evaporation source according to the measurement example 15. As shown in these drawings, in the measurement examples 11 to 15, a larger number of magnetic lines of force directly extend toward the substrate 6 from near the center of the target 2, and magnetic lines of force that are the farthest from the axis of the target 2 converge in the direction toward the substrate 6. Therefore, in the measurement examples 11 to 15, ions can be efficiently carried to the substrate 6, and the evaluation results for the deposition rate all satisfy the acceptance criterion, thereby allowing for a higher deposition rate. Moreover, since a point where the perpendicular components of the magnetic lines of force become zero is generated on the target 2 with the positional arrangement according to the measurement examples 11 to 15, an arc discharge can be stably generated at this point. However, if the arc discharge is shifted outward too much, the ion-generated positions are also shifted outward too much, as mentioned above. This tends to lead to a reduced deposition rate due to the generated ions not being able to travel along the magnetic lines of force extending toward the substrate 6 from the center of the target 2. Because the point where the perpendicular components become zero is determined on the basis of the size and the position of the ring-shaped rear surface magnet 4B and the disk-shaped rear surface magnet 4A set at the rear side, the deposition rate can be increased by appropriately selecting the position and the size.

Based on a comparison between the measurement example 11 and the measurement example 12, the electric current value flowing through the substrate 6 increases with increasing thickness of the ring-shaped rear surface magnet 4B and decreasing distance from the surface of the target 2, resulting in a higher deposition rate.

Based on a comparison between the measurement example 12 and the measurement example 15, although the disk-shaped rear surface magnet 4A and the ring-shaped rear surface magnet 4B have identical shapes, the distances from the surface of the target 2 to the surface of the disk-shaped rear surface magnet 4A and to the surface of the ring-shaped rear surface magnet 4B are different.

Based on a comparison between the measurement example 13 and the measurement example 14, it is apparent that even when the disk-shaped rear surface magnet 4A and the ring-shaped rear surface magnet 4B are simultaneously provided, the deposition rate is higher when the diameter of the disk-shaped rear surface magnet 4A is increased relative to the diameter of the target 2.

Although an arc discharge tends to occur by priority at a point where the perpendicular components of magnetic lines of force become zero, as described above, the moving rate of an arc spot at that time is basically proportional to the strength of the parallel components of magnetic lines of force at that point. When the arc spot moves at a high rate, the occurrence of macro-particles (electrically neutral droplets) is suppressed.

Therefore, it is preferable that the strength of the parallel components of magnetic lines of force be high at the point where the perpendicular components of magnetic lines of force become zero. Specifically, the strength of the parallel components of magnetic lines of force is preferably 5 Gauss or higher, more preferably 20 Gauss or higher, and even more preferably 50 Gauss or higher.

In the case where the strength of the parallel components of magnetic lines of force is too high, the magnetic field becomes tightly bound and the discharge area becomes extremely narrow, resulting in uneven wear of the target 2 if the rear surface magnet 4 does not have moving means. In order to suppress such uneven wear, the strength of the parallel components of magnetic lines of force needs to be 200 Gauss or lower, and is preferably set to 100 Gauss or lower.

Furthermore, as shown in Table 3, an absolute value of film residual-stress in each of the measurement examples 11 to 15 is 2.0 GPa or lower, and the evaluation results for film residual-stress thus satisfy the acceptance criterion. Accordingly, a film with low residual stress can be formed by using the arc evaporation source according to each of the measurement examples 11 to 15.

In order to efficiently guide the magnetic flux of the rear surface magnet 4 toward the substrate 6, it is desirable that a material (yoke) with high magnetic permeability, such as iron, be disposed at the rear side of the target 2 together with the rear surface magnet 4.

If the disk-shaped rear surface magnet 4A and the ring-shaped rear surface magnet 4B are to be used in combination with each other, the size of the disk-shaped rear surface magnet 4A relative to the diameter of the target 2 is not particularly limited and is arbitrarily selectable in accordance with positions where perpendicular components of magnetic lines of force are to be generated.

In order to control the positions where parallel components of magnetic lines of force are to be generated on the surface of the target 2, an electromagnetic coil may be set coaxially with the disk-shaped rear surface magnet 4A and the ring-shaped rear surface magnet 4B, in addition to these magnets.

Fourth Embodiment

Next, a fourth embodiment using the evaporation source 1 according to the present invention will be described.

In this embodiment, a larger number of magnetic lines of force extend toward the substrate 6 so that a difference between the composition of elements included in a film formed on the substrate 6 and the composition of elements included in the target 2 is reduced. In a deposition method (film forming method) according to this embodiment, the composition of the target 2 to be used is solely changed in accordance with the aforementioned comparative measurement example 2 and the measurement example 11 according to the third embodiment of the present invention.

A composition analysis of the formed film is performed by using an EDX (elemental analyzer). Tables 4 and 5 show composition ratios obtained by excluding nitrogen from composition analysis results. Analytical conditions include an acceleration voltage of 20 kV, an operating distance of 15 mm, and an observation magnification of 1000×.

The composition ratio of the target 2 used in the deposition method shown in Table 4 is Al:Ti=50:50, and the composition ratio of the target 2 used in the deposition method shown in Table 5 is Al:Ti=70:30.

TABLE 4

| MEASUREMENT EXAMPLE | DIAMETER OF DISK-SHAPED REAR SURFACE MAGNET (mm) | THICKNESS OF DISK-SHAPED REAR SURFACE MAGNET (mm) | DISTANCE FROM SURFACE OF TARGET TO DISK-SHAPED REAR SURFACE MAGNET (mm) | OUTER DIAMETER OF RING-SHAPED REAR SURFACE MAGNET (mm) | INNER DIAMETER OF RING-SHAPED REAR SURFACE MAGNET (mm) | THICKNESS OF RING-SHAPED REAR SURFACE MAGNET (mm) | DISTANCE FROM SURFACE OF TARGET TO RING-SHAPED REAR SURFACE MAGNET (mm) | NUMBER OF REAR SURFACE MAGNETS | FILM COMPOSITION (at %) Al | Ti |
|---|---|---|---|---|---|---|---|---|---|---|
| 2 COMPARATIVE MEASUREMENT EXAMPLE | — | — | — | — | — | — | — | — | 45 | 55 |
| 11 MEASUREMENT EXAMPLE ACCORDING TO PRESENT INVENTION | 100 | 3 | 40 | 170 | 150 | 10 | 40 | 2 | 47 | 53 |

TABLE 5

| MEASUREMENT EXAMPLE | DIAMETER OF DISK-SHAPED REAR SURFACE MAGNET (mm) | THICKNESS OF DISK-SHAPED REAR SURFACE MAGNET (mm) | DISTANCE FROM SURFACE OF TARGET TO DISK-SHAPED REAR SURFACE MAGNET (mm) | OUTER DIAMETER OF RING-SHAPED REAR SURFACE MAGNET (mm) | INNER DIAMETER OF RING-SHAPED REAR SURFACE MAGNET (mm) | THICKNESS OF RING-SHAPED REAR SURFACE MAGNET (mm) | DISTANCE FROM SURFACE OF TARGET TO RING-SHAPED REAR SURFACE MAGNET (mm) | NUMBER OF REAR SURFACE MAGNETS | FILM COMPOSITION (at %) Al | Ti |
|---|---|---|---|---|---|---|---|---|---|---|
| 2 COMPARATIVE MEASUREMENT EXAMPLE | — | — | — | — | — | — | — | — | 66 | 34 |

TABLE 5-continued

| MEASUREMENT EXAMPLE | DIAMETER OF DISK-SHAPED REAR SURFACE MAGNET (mm) | THICKNESS OF DISK-SHAPED REAR SURFACE MAGNET (mm) | DISTANCE FROM SURFACE OF TARGET TO DISK-SHAPED REAR SURFACE MAGNET (mm) | OUTER DIAMETER OF RING-SHAPED REAR SURFACE MAGNET (mm) | INNER DIAMETER OF RING-SHAPED REAR SURFACE MAGNET (mm) | THICKNESS OF RING-SHAPED REAR SURFACE MAGNET (mm) | DISTANCE FROM SURFACE OF TARGET TO RING-SHAPED REAR SURFACE MAGNET (mm) | NUMBER OF REAR SURFACE MAGNETS | FILM COMPOSITION (at %) Al | Ti |
|---|---|---|---|---|---|---|---|---|---|---|
| 11 MEASUREMENT EXAMPLE ACCORDING TO PRESENT INVENTION | 100 | 3 | 40 | 170 | 150 | 10 | 40 | 2 | 71 | 29 |

Referring to Tables 4 and 5, in the comparative measurement example 2, the Al composition in the film is reduced, as compared with the composition of the target 2, and a change thereof is prominent in a test (Table 5) corresponding to Al:Ti=70:30 in which the amount of Al is large.

On the other hand, in the measurement example 11 according to the present invention, a deviation (difference) between the composition of the target 2 and the composition ratio of Al and Ti in the film is apparently smaller, as compared with the measurement example 2. Accordingly, with the arc evaporation source 1 according to the present invention, since magnetic lines of force are induced toward the substrate 6 from the target 2, ion particles evaporated from the target 2 can be efficiently carried to the substrate 6, thereby reducing the deviation between the composition ratios of the target 2 and the formed film.

Specifically, in the film forming method according to this embodiment, since the aforementioned arc evaporation source 1 is used for forming a film on the substrate 6, a difference between the composition ratio of the elements in the film on the substrate 6 and the composition ratio of the elements in the target 2 can be reduced even if the target 2 used includes two or more kinds of elements, whereby the composition of the film can be accurately controlled on the basis of the composition of the target 2.

Furthermore, although a film that tends to become delaminated due to residual stress is obtained in the related art when the film is increased in thickness on the substrate 6, the aforementioned arc evaporation source 1 can form a film with low residual stress, whereby a practically useful thick film that is less likely to become delaminated even with a thickness of 5 μm or larger can be obtained.

The composition of the target 2 may include at least one of Al, Ti, and Cr.

The present invention is not to be limited to the embodiments and examples described above, and appropriate alterations are permissible within the scope of the invention defined in the claims.

The target 2 may have a freely-chosen shape other than a disk shape.

In detail, the projection shape of the target 2 may be a point-symmetrical shape (such as a square shape or a hexagonal shape), and in that case, the outer circumferential magnet 3 and the rear surface magnet 4 do not necessarily need to be disposed coaxially with the target 2. However, the outer circumferential magnet 3 and the rear surface magnet 4 are preferably disposed such that central axes thereof (i.e., rotational axes thereof if the outer circumferential magnet 3 and the rear surface magnet 4 are rotatable symmetrical members) extend through the target 2.

Furthermore, the target 2 may have a shape such that the projection shape thereof has a longitudinal axis (such as an ellipsoidal shape or a rectangular shape). In this case, if the projection shape of the target 2 is ellipsoidal, the diameter may be read as a major axis and a minor axis, or if the projection shape is rectangular, the diameter may be read as a long side and a short side.

The outer circumferential magnet 3 may be of any type that surrounds the outer periphery of the target 2, and if the target 2 has a projection shape other than a circular shape described above, the outer circumferential magnet 3 used may be formed of a ring-shaped permanent magnet having a shape that conforms to the projection shape of the target 2 (for example, if the target 2 is ellipsoidal, an ellipsoidal permanent magnet formed to surround the target 2 may be used).

For example, in accordance with the projection shape of the target 2, the outer circumferential magnet 3 may have a point-symmetrical shape (such as a square shape or a hexagonal shape) or a shape having a longitudinal axis (such as an ellipsoidal shape or a rectangular shape) so as to surround the target 2.

The rear surface magnet 4 may have a freely-chosen shape other than a disk shape or a circular ring shape, and may be a permanent magnet with a point-symmetrical projection shape (such as a square shape or a hexagonal shape), a permanent magnet whose projection shape has a longitudinal axis (such as an ellipsoidal shape or a rectangular shape), or a ring-shaped permanent magnet whose projection shape includes the aforementioned shapes for the outer periphery and the inner periphery thereof.

The projection shape of the rear surface magnet 4 is preferably similar to the projection shape of the target 2.

Furthermore, each of the outer circumferential magnet 3 and the rear surface magnet 4 may be provided in a plurality.

The specific embodiments of the invention described above mainly include the following configurations.

An arc evaporation source according to the present invention evaporates a surface of a target by an arc discharge and includes at least one outer circumferential magnet that is provided to surround an outer periphery of the target and that is disposed such that a direction of magnetization thereof is normal to the surface of the target, and a rear surface magnet disposed at a rear side of the target. The rear surface magnet has a first non-ring-shaped permanent magnet disposed such that a polarity of the rear surface magnet and a polarity of the outer circumferential magnet are oriented in the same direction and that a direction of magnetization of the rear surface magnet is normal to the surface of the target.

In order to generate a magnetic field with a large strength of horizontal components on the surface (target evaporation surface) of the target, the present invention has a basic configuration in which the outer circumferential magnet is disposed around the outer periphery of the target, and a magnet having a polarity oriented in the same direction as that of the outer circumferential magnet is disposed at the rear side of the target, whereby a repulsive magnetic field is generated by both magnets on the surface of the target. With such a magnetic configuration, the arc rotation is increased in speed, and the occurrence of macro-particles is reduced, whereby a smooth film can be formed. The reason the outer circumferential magnet is disposed to surround the outer periphery of the target is to increase the strength of the horizontal components of the magnetic field formed on the surface of the target.

In the present invention, because the rear surface magnet provided at the rear side of the target is a permanent magnet, a large number of magnetic lines of force can be induced toward a substrate. Supposing that a solenoid coil is provided at the rear side of the target, since magnetic lines of force are generated only from inside the coil, an area where magnetic lines of force are generated is small. This tends to cause the magnetic lines of force to disperse. In contrast, in the present invention, since a non-ring-shaped permanent magnet is used as the rear surface magnet instead of a solenoid coil, magnetic lines of force are generated from a wide region of an opposed surface (i.e., a surface facing the target) of the rear surface magnet, so that the rectilinear properties of the magnetic lines of force are improved. In addition, with the use of the non-ring-shaped permanent magnet, strong magnetic lines of force are also generated from a central portion (opposed surface) of the magnet, thereby increasing the number of magnetic lines of force extending toward the substrate serving as object on which a film is to be formed.

As a result, the number of magnetic lines of force induced toward the substrate is increased, whereby the deposition rate can be increased and a film with low residual stress can be formed.

Preferably, the rear surface magnet further has a second non-ring-shaped permanent magnet that is provided between the first permanent magnet and the target or at a rear side of the first permanent magnet and that is disposed with a certain distance from the first permanent magnet. In this case, the second permanent magnet may be disposed such that a polarity of the second permanent magnet and the polarity of the outer circumferential magnet are oriented in the same direction and that a direction of magnetization of the second permanent magnet is normal to the surface of the target.

With the first permanent magnet and the second permanent magnet being arranged in series with a certain distance therebetween in this manner, the rectilinear properties of the magnetic lines of force are improved, and the number of magnetic lines of force is increased. As a result, the number of magnetic lines of force induced toward the substrate is increased, whereby the deposition rate can be further increased and a film with low residual stress can be formed.

Furthermore, the rear surface magnet may further have a ring-shaped permanent magnet which is a permanent magnet provided in the form of a ring such that the polarity of the rear surface magnet and the polarity of the outer circumferential magnet are oriented in the same direction and that the direction of magnetization of the rear surface magnet is normal to the surface of the target. In this case, a projection of the ring-shaped permanent magnet and a projection of the target obtained by projecting the ring-shaped permanent magnet and the target in the direction normal to the surface of the target may be configured so as not to overlap each other.

In the present invention, the term "permanent magnet provided in the form of a ring" refers not only to a single permanent magnet having a ring shape, but also to multiple permanent magnets arranged in the form of a ring. Furthermore, the term "ring" is not limited to a perfect circle, but also includes an ellipsoid and a polygon.

Because a ring-shaped permanent magnet is capable of generating magnetic lines of force with high rectilinear properties within the ring, the rectilinear properties of the magnetic lines of force are improved over a wide region in front of the target by providing a ring-shaped permanent magnet that is larger than the target. As a result, the number of magnetic lines of force induced toward the substrate is increased, whereby the deposition rate can be increased and a film with low residual stress can be formed.

Furthermore, the outer circumferential magnet and the rear surface magnet preferably generate a magnetic field on the surface of the target, the magnetic field having a point where a component of a magnetic line of force acting in the direction normal to the surface of the target becomes zero.

Since an arc discharge tends to occur by priority at a point where perpendicular components of a magnetic field (i.e., components of the magnetic field that are perpendicular to the surface of the target) become zero, such a point where the perpendicular components of the magnetic lines of force on the surface of the target become zero is produced in the magnetic field generated by the outer circumferential magnet and the rear surface magnet so that an arc discharge occurs by priority at that point, whereby the arc discharge can be stabilized at that point.

Furthermore, the target may be disk-shaped, and the outer circumferential magnet may be a permanent magnet provided in the form of a ring.

An area of a surface of the first permanent magnet is preferably ¼ or more of an area of the surface of the target.

By setting the area of the surface of the rear surface magnet to ¼ or more of the area of the surface of the target in this manner, the orientation of the magnetic lines of force changes significantly depending on the direction toward the substrate, and some of the magnetic lines of force directly extend toward the substrate from the surface of the target, whereby ions evaporated from the target can be induced toward the substrate more efficiently.

More preferably, a shape of a projection of the first permanent magnet obtained by projecting the first permanent magnet in a direction normal to a surface thereof is similar to a shape of a projection of the target obtained by projecting the target in the direction normal to the surface thereof.

Another arc evaporation source according to the present invention evaporates a surface of a target by an arc discharge and includes at least one outer circumferential magnet that is provided to surround an outer periphery of the target and that is disposed such that a direction of magnetization thereof is normal to the surface of the target, and a rear surface magnet disposed at a rear side of the target. The rear surface magnet has a ring-shaped permanent magnet which is a permanent magnet provided in the form of a ring such that a polarity of the rear surface magnet and a polarity of the outer circumferential magnet are oriented in the same direction and that a direction of magnetization of the rear surface magnet is normal to the surface of the target. A projection of the ring-shaped permanent magnet and a projection of the target obtained by projecting the ring-shaped permanent magnet and the target in the direction normal to the surface of the target do not overlap each other.

In the present invention, the term "permanent magnet provided in the form of a ring" refers not only to a single permanent magnet having a ring shape, but also to multiple permanent magnets arranged in the form of a ring. Furthermore, the term "ring" is not limited to a perfect circle, but also includes an ellipsoid and a polygon.

By arranging the outer circumferential magnet and the ring-shaped permanent magnet, which is capable of generating a magnetic field with high rectilinear properties within the ring, in series in this manner, the number of magnetic lines of force induced toward the substrate is increased, whereby the deposition rate can be increased and a film with low residual stress can be formed.

By making the ring-shaped permanent magnet disposed at the rear side of the target larger than the target so that the projections of the ring-shaped permanent magnet and the target obtained by projecting the ring-shaped permanent magnet and the target in the direction normal to the surface of the target do not overlap each other, the rectilinear properties of magnetic lines of force extending toward the substrate are improved, and the number of magnetic lines of force induced toward the substrate is further increased.

Another arc evaporation source according to the present invention evaporates a surface of a target by an arc discharge and includes at least one outer circumferential magnet that is provided to surround an outer periphery of the target and that is disposed such that a direction of magnetization thereof is normal to the surface of the target, and a rear surface magnet disposed at a rear side of the target. The rear surface magnet is formed of a permanent magnet disposed such that a polarity of the rear surface magnet and a polarity of the outer circumferential magnet are oriented in the same direction and that a direction of magnetization of the rear surface magnet is normal to the surface of the target.

Since the outer circumferential magnet is disposed to surround the target, and the rear surface magnet whose polarity is oriented in the same direction as the polarity of the outer circumferential magnet and whose direction of magnetization is aligned with the direction of magnetization of the outer circumferential magnet is disposed at the rear side of the target, magnetic lines of force can be induced toward a substrate. Furthermore, since the permanent magnet constituting the rear surface magnet has high magnetic coercivity, compactness can be achieved without having to increase the size of the mechanism.

The rear surface magnet may be ring-shaped.

Accordingly, magnetic lines of force in front of the target extend toward the substrate so that ions can be efficiently carried to the substrate. If the outer periphery of the rear surface magnet is smaller than the outer periphery of the target, the magnetic lines of force tend to diverge outward relative to the direction toward the substrate. However, by forming the rear surface magnet in the form of a ring, components of magnetic lines of force extend directly toward the substrate from a central portion of the target, whereby the ions can be efficiently converged. Furthermore, in the case where the outer diameter is larger than the outer periphery of the target, the magnetic lines of force entirely tend to extend toward the substrate, whereby the ions can be converged in the direction toward the substrate.

Furthermore, the rear surface magnet may include a first permanent magnet and a ring-shaped permanent magnet which is a permanent magnet provided in the form of a ring. The first permanent magnet may be disposed such that a polarity of the first permanent magnet and the polarity of the outer circumferential magnet are oriented in the same direction and that a direction of magnetization of the first permanent magnet is normal to the surface of the target. The ring-shaped permanent magnet may be disposed such that a polarity of the ring-shaped permanent magnet and the polarity of the outer circumferential magnet are oriented in the same direction and that a direction of magnetization of the ring-shaped permanent magnet is normal to the surface of the target.

Accordingly, components of magnetic lines of force directly extend toward the substrate from near the center of the target, and components of magnetic lines of force at the outer side converge more toward the substrate.

In the aforementioned arc evaporation source, the first permanent magnet is preferably of a non-ring-shaped type having an opposed surface disposed facing toward the rear surface of the target, and the opposed surface of the first permanent magnet is preferably made of a continuous surface extending over an entire region surrounded by the outer peripheral edge thereof.

With this configuration, since the non-ring-shaped permanent magnet having the opposed surface made of a continuous surface over the entire region surrounded by the outer peripheral edge is used as the rear surface magnet instead of a solenoid coil, magnetic lines of force are generated from a wide region of the opposed surface (i.e., the surface facing the target) of the rear surface magnet, so that the rectilinear properties of the magnetic lines of force are improved. In addition, with the use of the non-ring-shaped permanent magnet, strong magnetic lines of force are also generated from a central portion (opposed surface) of the magnet, thereby increasing the number of magnetic lines of force extending toward the substrate serving as an object on which a film is to be formed.

The opposed surface of the first permanent magnet is preferably a surface parallel with the surface of the target. Accordingly, magnetic lines of force can be uniformly arranged on the surface of the first permanent magnet. Moreover, by making the opposed surface of the first permanent magnet flat, magnetic lines of force extending from the opposed surface of the first permanent magnet can more effectively be made to extend parallel with the direction toward the target.

In the aforementioned arc evaporation source, the second permanent magnet is preferably of a non-ring-shaped type having an opposed surface disposed facing toward the rear surface of the target, and the opposed surface of the second permanent magnet is preferably made of a continuous surface extending over an entire region surrounded by the outer peripheral edge thereof.

With this configuration, since the first permanent magnet and the second permanent magnet are arranged in series with a certain distance therebetween, the rectilinear properties of the magnetic lines of force are improved, and the number of magnetic lines of force is increased. As a result, the number of magnetic lines of force induced toward the substrate is increased, whereby the deposition rate can be further increased and a film with low residual stress can be formed.

A film forming method according to the present invention includes evaporating a target including at least two elements by using the aforementioned arc evaporation source so as to form a film including the at least two elements.

Accordingly, when a film including multiple elements is formed, a difference between the composition ratio of elements in the target and the composition ratio of elements in the film is reduced, whereby the composition of the film can be accurately controlled on the basis of the composition of the target.

Another film forming method according to the present invention includes evaporating a target including at least one of Al, Ti, and Cr elements by using the aforementioned arc evaporation source so as to form a film composed of a nitride, a carbide, or a carbonitride comprising the element to a thickness of at least 5 μm.

Accordingly, although a film that tends to become delaminated due to residual stress is obtained in the related art when the film is increased in thickness, the aforementioned arc evaporation source can form a film with low residual stress, whereby a practically useful thick film that is less likely to become delaminated even with a thickness of 5 μm or larger can be obtained.

INDUSTRIAL APPLICABILITY

The present invention can be utilized as an arc evaporation source in a deposition apparatus that forms a thin film.

REFERENCE SIGNS LIST 1 evaporation source (arc evaporation source)
2 target
3 outer circumferential magnet
4 rear surface magnet
4A disk-shaped rear surface magnet
4B ring-shaped rear surface magnet
5 deposition apparatus
6 substrate
7 magnetic-field generating means
11 vacuum chamber
12 rotating table
13 gas inlet
14 gas outlet
15 arc power source
16 bias power source
17 anode
18 ground
A arrow indicating magnetic line of force farthest from axis of target in measurement example 1
B arrow indicating magnetic line of force farthest from axis of target in measurement example 2
C arrow indicating magnetic line of force farthest from axis of target in measurement example 3
D arrow indicating magnetic line of force farthest from axis of target in measurement example 4
A' arrow indicating magnetic line of force closest to axis of target in measurement example 1
B' arrow indicating magnetic line of force closest to axis of target in measurement example 2
C' arrow indicating magnetic line of force closest to axis of target in measurement example 3
D' arrow indicating magnetic line of force closest to axis of target in measurement example 4
E arrow indicating components of magnetic lines of force directly extending toward substrate from near center of target in measurement example 3
F arrow indicating components of magnetic lines of force directly extending toward substrate from near center of target in measurement example 4

The invention claimed is:

1. An arc evaporation source for evaporating a surface of a target by an arc discharge, the arc evaporation source comprising:
at least one outer circumferential magnet surrounding an outer periphery of a target when set in the arc evaporation source; and
a rear surface magnet disposed at a rear side of the target when set in the arc evaporation source,
wherein the at least one outer circumferential magnet is disposed such that a direction of its magnetization is normal to the surface of the target when set in the arc evaporation source,
wherein the rear surface magnet comprises a first non-ring-shaped permanent magnet and a second non-ring-shaped permanent magnet,
wherein a normal axis passing through the center of the target also passes through the centers of the first and second permanent magnets,
wherein a polarity of the rear surface magnet and a polarity of the outer circumferential magnet are in the same direction, and
wherein a direction of magnetization of the rear surface magnet is normal to the surface of the target when set in the arc evaporation source,
wherein the second non-ring-shaped permanent magnet is disposed between the first non-ring-shaped permanent magnet and the target when set in the arc evaporation source or at a rear side of the first non-ring-shaped permanent magnet,
wherein the second non-ring-shaped permanent magnet is a certain distance from the first non-ring-shaped permanent magnet,
wherein a polarity of the second non-ring-shaped permanent magnet and the polarity of the outer circumferential magnet are in the same direction, and
wherein the second permanent magnet is disposed such that a direction of magnetization of the second permanent magnet is normal to the surface of the target when set in the arc evaporation source.

2. The arc evaporation source of claim 1,
wherein the rear surface magnet further comprises a ring-shaped permanent magnet, and
wherein a projection of the ring-shaped permanent magnet and a projection of the target when set in the arc evaporation source obtained by projecting the ring-shaped permanent magnet and the target when set in the arc evaporation source in the direction normal to the surface of the target when set in the arc evaporation source do not overlap each other.

3. The arc evaporation source of claim 1,
wherein the outer circumferential magnet and the rear surface magnet are disposed to generate a magnetic field on the surface of the target when set in the arc evaporation source, and
the magnetic field has a point where a component of a magnetic line of force acting in the direction normal to the surface of the target when set in the arc evaporation source is zero.

4. The arc evaporation source of claim 1,
wherein the target is disk-shaped, and
wherein the outer circumferential magnet is a permanent magnet in the form of a ring.

5. The arc evaporation source of claim 1,
wherein an area of a surface of the first non-ring-shaped permanent magnet facing the target is ¼ or more of an area of the surface of the target facing the non-ring-shaped permanent magnet when set in the arc evaporation source.

6. The arc evaporation source of claim 1,
wherein a shape of a projection of the first non-ring-shaped permanent magnet obtained by projecting the first non-ring-shaped permanent magnet in a direction normal to a surface thereof repeats a shape of a projection of the target when set in the arc evaporation source obtained by projecting the target when set in the arc evaporation source in the direction normal to the surface thereof.

7. An arc evaporation source for evaporating a surface of a target by an arc discharge, the arc evaporation source comprising:
at least one outer circumferential magnet disposed to surround an outer periphery of the target when set in the arc evaporation source; and
a rear surface magnet disposed at a rear side of the target when set in the arc evaporation source,
wherein the at least one outer circumferential magnet is disposed such that a direction of its magnetization is normal to the surface of the target when set in the arc evaporation source,
wherein the rear surface magnet comprises a ring-shaped permanent magnet and a non-ring-shaped permanent magnet, wherein a normal axis passing through the center of the target also passes through the center of the non-ring-shaped permanent magnet,
wherein a polarity of the rear surface magnet and a polarity of the outer circumferential magnet are in the same direction,
wherein a direction of magnetization of the rear surface magnet is normal to the surface of the target when set in the arc evaporation source, and
wherein a projection of the ring-shaped permanent magnet and a projection of the target when set in the arc evaporation source obtained by projecting the ring-shaped permanent magnet and the target when set in the arc evaporation source in the direction normal to the surface of the target when set in the arc evaporation source do not overlap each other.

8. The arc evaporation source of claim 7,
wherein the target is disk-shaped, and
wherein the outer circumferential magnet is a permanent magnet in the form of a ring.

9. The arc evaporation source of claim 1, wherein the rear surface magnet further comprises a ring-shaped permanent magnet.

10. A film forming method comprising:
evaporating a target including at least two elements to form a film including the at least two elements,
wherein the evaporating employs the arc evaporation source of claim 1.

11. A film forming method comprising:
evaporating a target comprising at least one element selected from the group consisting of Al, Ti, and Cr to form a film comprising a nitride, a carbide, or a carbonitride,
wherein the evaporating employs the arc evaporation source of claim 1, and
the film has a thickness of at least 5 μm.

12. The arc evaporation source of claim 1, wherein the first non-ring shaped permanent magnet is not formed from multiple permanent magnets arranged in the form of a ring or ellipsoid or polygon.

13. The arc evaporation source of claim 7, wherein the non-ring shaped permanent magnet is not formed from multiple permanent magnets arranged in the form of a ring or ellipsoid or polygon.

14. The arc evaporation source of claim 1, wherein the first non-ring-shaped permanent magnet has an opposed surface disposed facing toward the rear surface of the target, and the opposed surface of the first non-ring-shaped permanent magnet is made of a continuous surface extending over an entire region surrounded by the outer peripheral edge thereof.

15. The arc evaporation source of claim 1, wherein the first non-ring-shaped permanent magnet does not have a hollow donut shape with a hole in a radially inner section, and is a solid disk-shaped or a cylindrical-shaped magnet, and wherein normal lines of the entire outer side surface of the first non-ring shaped permanent magnet do not intersect.

16. An arc evaporation source for evaporating a surface of a target by an arc discharge, the arc evaporation source comprising:
at least one outer circumferential magnet surrounding an outer periphery of a target when set in the arc evaporation source; and
a rear surface magnet disposed at a rear side of the target when set in the arc evaporation source,
wherein the at least one outer circumferential magnet is disposed such that a direction of its magnetization is normal to the surface of the target when set in the arc evaporation source,
wherein the rear surface magnet comprises a first non-ring-shaped permanent magnet and a normal axis passing through the center of the target also passes through the center of the first non-ring-shaped permanent magnet,
wherein a polarity of the rear surface magnet and a polarity of the outer circumferential magnet are in the same direction, and wherein a direction of magnetization of the rear surface magnet is normal to the surface of the target when set in the arc evaporation source,
wherein the rear surface magnet further comprises a ring-shaped permanent magnet, and
wherein a projection of the ring-shaped permanent magnet and a projection of the target when set in the arc evaporation source obtained by projecting the ring-shaped permanent magnet and the target when set in the arc evaporation source in the direction normal to the surface of the target when set in the arc evaporation source do not overlap each other.

17. The arc evaporation source of claim 16,
wherein the outer circumferential magnet and the rear surface magnet are disposed to generate a magnetic field on the surface of the target when set in the arc evaporation source, and
the magnetic field has a point where a component of a magnetic line of force acting in the direction normal to the surface of the target when set in the arc evaporation source-is zero.

18. The arc evaporation source of claim 16,
wherein the target is disk-shaped, and
wherein the outer circumferential magnet is a permanent magnet in the form of a ring.

19. The arc evaporation source of claim 16,
wherein an area of a surface of the first non-ring-shaped permanent magnet facing the target is ¼ or more of an area of the surface of the target facing the non-ring-shaped permanent magnet when set in the arc evaporation source.

20. The arc evaporation source of claim 16,
wherein a shape of a projection of the first non-ring-shaped permanent magnet obtained by projecting the first non-ring-shaped permanent magnet in a direction normal to a surface thereof repeats a shape of a projection of the target when set in the arc evaporation source obtained by projecting the target when set in the arc evaporation source in the direction normal to the surface thereof.

21. A film forming method comprising:
evaporating a target including at least two elements to form a film including the at least two elements,
wherein the evaporating employs the arc evaporation source of claim 16.

22. A film forming method comprising:
evaporating a target comprising at least one element selected from the group consisting of Al, Ti, and Cr to form a film comprising a nitride, a carbide, or a carbonitride,
wherein the evaporating employs the arc evaporation source of claim 16, and
the film has a thickness of at least 5 μm.

23. The arc evaporation source of claim 16, wherein the first non-ring shaped permanent magnet is not formed from multiple permanent magnets arranged in the form of a ring or ellipsoid or polygon.

24. The arc evaporation source of claim 16, wherein the first non-ring-shaped permanent magnet has an opposed surface disposed facing toward the rear surface of the target, and the opposed surface of the first non-ring-shaped permanent magnet is made of a continuous surface extending over an entire region surrounded by the outer peripheral edge thereof.

25. The arc evaporation source of claim 16, wherein the first non-ring-shaped permanent magnet does not have a hollow donut shape with a hole in a radially inner section, and is a solid disk-shaped or a cylindrical-shaped magnet, and wherein normal lines of the entire outer side surface of the first non-ring shaped permanent magnet do not intersect.

26. The arc evaporation source of claim 1, wherein the first non-ring-shaped permanent magnet, the second non-ring-shaped permanent magnet, or both have a shape of a disk or a cylinder.

27. The arc evaporation source of claim 7, wherein the rear surface magnet comprises a first non-ring-shaped permanent magnet, second non-ring-shaped permanent magnet, or both that have a shape of a disk or a cylinder and a normal axis passing through the target also passes through the center of the first, second, or both non-ring-shaped permanent magnets.

28. The arc evaporation source of claim 2, wherein the central axis of the ring-shaped permanent magnet is also the central axis of the first non-ring-shaped permanent magnet and the second non-ring-shaped permanent magnet.

\* \* \* \* \*